(12) United States Patent
McCorquodale et al.

(10) Patent No.: US 7,924,110 B2
(45) Date of Patent: *Apr. 12, 2011

(54) MONOLITHIC CLOCK GENERATOR AND TIMING/FREQUENCY REFERENCE

(75) Inventors: Michael Shannon McCorquodale, Ann Arbor, MI (US); Scott Michael Pernia, Pinckney, MI (US); Amar Sarbbasesh Basu, Troy, MI (US)

(73) Assignee: Integrated Device Technology, Inc., San Jose, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 12/435,269

(22) Filed: May 4, 2009

(65) Prior Publication Data

US 2010/0019856 A1 Jan. 28, 2010

Related U.S. Application Data

(63) Continuation of application No. 11/796,821, filed on Apr. 28, 2007, now Pat. No. 7,548,132, which is a continuation of application No. 11/084,962, filed on Mar. 21, 2005, now Pat. No. 7,227,423.

(60) Provisional application No. 60/555,193, filed on Mar. 22, 2004.

(51) Int. Cl.
*H03B 5/12* (2006.01)
*H03L 1/02* (2006.01)

(52) U.S. Cl. .................. 331/179; 331/117 FE; 331/176

(58) Field of Classification Search .................. 331/1 A, 331/2, 8, 10, 11, 16–18, 25, 36 C, 36 L, 57, 331/117 R, 177 FE, 117 D, 173, 175, 177 R, 177 V, DIG. 2, 176

See application file for complete search history.

(56) References Cited

U.S. PATENT DOCUMENTS

| 4,847,876 | A  | * | 7/1989  | Baumbach et al. ........... 375/364 |
| 5,699,024 | A  | * | 12/1997 | Manlove et al. .............. 331/111 |
| 6,154,095 | A  | * | 11/2000 | Shigemori et al. ............. 331/16 |
| 6,356,161 | B1 | * | 3/2002  | Nolan et al. .................. 331/176 |
| 7,116,183 | B2 | * | 10/2006 | Wu .............................. 331/176 |
| 7,227,423 | B2 | * | 6/2007  | McCorquodale et al. .... 331/179 |
| 2001/0020875 | A1 | * | 9/2001 | Jansson .......................... 331/44 |

* cited by examiner

*Primary Examiner* — David Mis
(74) *Attorney, Agent, or Firm* — Myers Bigel Sibley & Sajovec, P.A.

(57) ABSTRACT

In various embodiments, the invention provides a clock generator and/or a timing and frequency reference, with multiple operating modes, such power conservation, clock, reference, and pulsed modes. The various apparatus embodiments include a resonator adapted to provide a first signal having a resonant frequency; an amplifier; a temperature compensator adapted to modify the resonant frequency in response to temperature; and a process variation compensator adapted to modify the resonant frequency in response to fabrication process variation. In addition, the various embodiments may also include a frequency divider adapted to divide the first signal having the resonant frequency into a plurality of second signals having a corresponding plurality of frequencies substantially equal to or lower than the resonant frequency; and a frequency selector adapted to provide an output signal from the plurality of second signals. The output signal may be provided in any of various forms, such as differential or single-ended, and substantially square-wave or sinusoidal.

37 Claims, 17 Drawing Sheets

TEMPERATURE/BIAS DEPENDENCE

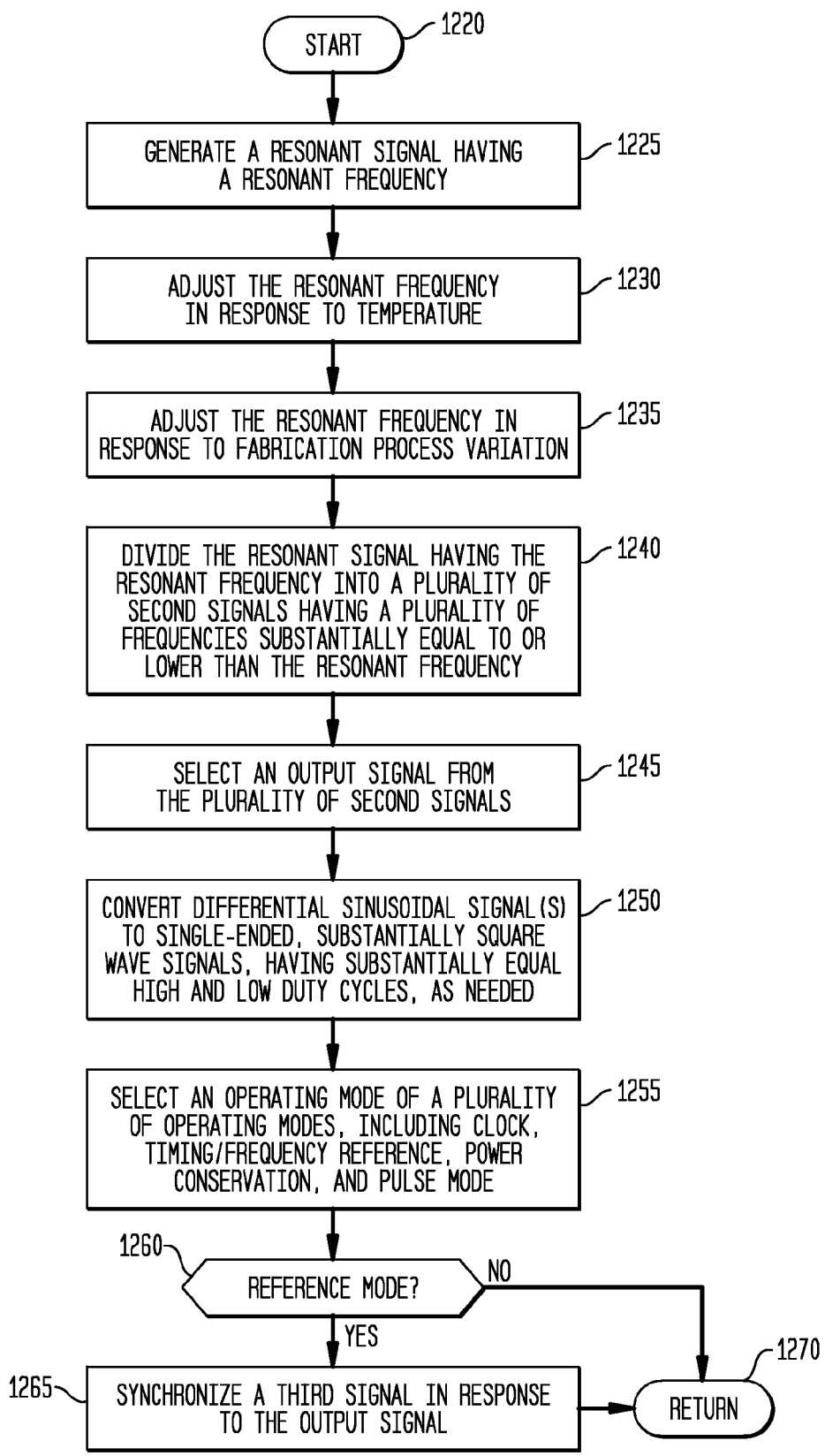

US 7,924,110 B2

MONOLITHIC CLOCK GENERATOR AND TIMING/FREQUENCY REFERENCE

CROSS-REFERENCE TO RELATED APPLICATIONS

This application is a continuation of and claims priority to U.S. patent application Ser. No. 11/796,821, filed Apr. 28, 2007, inventors Michael Shannon McCorquodale, Scott Michael Pernia, and Amar Sarbbaseh Basu, entitled "Monolithic Clock Generator and Timing/Frequency Reference" (the "first related application"), which is commonly assigned herewith, the contents of which are incorporated herein by reference, and with priority claimed for all commonly disclosed subject matter, which further is a continuation of and claims priority to U.S. patent application Ser. No. 11/084,962, filed Mar. 21, 2005, now U.S. Pat. No. 7,227,423 issued Jun. 5, 2007, inventors Michael Shannon McCorquodale, Scott Michael Pernia, and Amar Sarbbaseh Basu, entitled "Monolithic Clock Generator and Timing/Frequency Reference" (the "second related application"), which is commonly assigned herewith, the contents of which are incorporated herein by reference, and with priority claimed for all commonly disclosed subject matter, which further claims priority to U.S. Provisional Patent Application Ser. No. 60/555,193, filed Mar. 22, 2004, inventor Michael Shannon McCorquodale, entitled "Monolithic and Top-Down Clock Synthesis with Micromachined Radio Frequency Reference" (the "third related application"), which is commonly assigned herewith, the contents of which are incorporated herein by reference, and with priority claimed for all commonly disclosed subject matter.

This application is also related to and claims priority to U.S. patent application Ser. No. 11/085,372, filed Mar. 21, 2005, now U.S. Pat. No. 7,227,424 issued Jun. 5, 2007, inventors Michael Shannon McCorquodale and Scott Michael Pernia, entitled "Transconductance and Current Modulation for Resonant Frequency Control and Selection" (the "fourth related application"), which is commonly assigned herewith, the contents of which are incorporated herein by reference, and with priority claimed for all commonly disclosed subject matter, and which further claims priority to the third related application.

FIELD OF THE INVENTION

The present invention, in general, relates to oscillation or clocking signal generation, and more particularly, relates to a clock signal generator and timing/frequency reference which is free-running, self-referenced, accurate over fabrication process, voltage and temperature, has low jitter, and which may be monolithically integrated with other circuitry to form a single integrated circuit.

BACKGROUND OF THE INVENTION

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") driven by their clock signal. For example, microprocessors such as the Intel Pentium processor require a separate clock IC. As a consequence, virtually every circuit requiring an accurate clock signal requires an off-chip clock generator.

There are several consequences for such non-integrated solutions. For example, because such a processor must be connected through outside circuitry (such as on a printed circuit board (PCB)), power dissipation is comparatively increased. In applications which rely on a finite power supply, such as battery power in mobile communications, such additional power dissipation is detrimental.

In addition, such non-integrated solutions, by requiring an additional IC, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not very accurate, particularly over fabrication process, voltage, and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability. In addition, these clock generators or oscillators often exhibit considerable frequency drift, jitter, have a comparatively low Q-value, and are subject to other distortions from noise and other interference.

As a consequence, a need remains for a clock generator or timing reference which may be integrated monolithically with other circuitry, as a single IC, and which is highly accurate over PVT variations. Such a clock generator or timing reference should be free-running and self-referencing, and should not require locking or referencing to another reference signal. Such as clock generator or timing reference should exhibit minimal frequency drift and have comparatively low jitter, and should be suitable for applications requiring a highly accurate system clock. Such a clock generator or timing reference should also provide multiple operating modes, including a clock mode, a reference mode, a power conservation mode, and a pulsed mode.

SUMMARY OF THE INVENTION

In various exemplary embodiments, the invention provides a low-jitter, free-running and self-referencing clock generator and/or a timing and frequency reference which is highly accurate over PVT variations and which can be integrated monolithically with other circuitry, to form a singular integrated circuit. No separate reference oscillator is required. The various exemplary embodiments of the invention include features for highly accurate frequency generation over fabrication process, voltage, and temperature ("PVT") variations. These features include frequency tuning and selection, and compensation for frequency variations which may be caused due to temperature and/or voltage fluctuations and fabrication process variations.

In addition, the various exemplary embodiments of the invention provide a clock generator and/or a timing and frequency reference having multiple operating modes, including modes such as a power conservation mode, a clock mode, a reference mode, and a pulsed mode. In addition, the various embodiments provide multiple output signals at different frequencies, and provide low-latency and glitch-free switching between these various signals.

Significantly, the various exemplary embodiments of the invention generate a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and noise power reduced by $N^2$. As a consequence, the various exemplary embodiments of the invention result in significantly less jitter than available with other oscillators, such as ring oscillators.

The various apparatus embodiments include a resonator, an amplifier, and a frequency controller, which may include various components or modules such as a temperature compensator, a process variation compensator, a voltage isolator, a frequency divider, and a frequency selector. The resonator provides a first signal having a resonant frequency. A temperature compensator adjusts the resonant frequency in response to temperature, and the process variation compensator adjusts the resonant frequency in response to fabrication process variation. In addition, the various embodiments may also include a frequency divider to divide the first signal having the resonant frequency into a plurality of second signals having a corresponding plurality of frequencies substantially equal to or lower than the resonant frequency; and a frequency selector to provide an output signal from the plurality of second signals. The frequency selector may further include a glitch-suppressor. The output signal may be provided in any of various forms, such as differential or single-ended, and substantially square-wave or sinusoidal.

The present invention may also include a mode selector coupled to the frequency selector, wherein the mode selector is adapted to provide a plurality of operating modes, which may be selected from a group comprising a clock mode, a timing and frequency reference mode, a power conservation mode, and a pulse mode.

For a reference mode, the invention may also include a synchronization circuit coupled to the mode selector; and a controlled oscillator coupled to the synchronization circuit and adapted to provide a third signal; wherein in the timing and reference mode, the mode selector is further adapted to couple the output signal to the synchronization circuit to control timing and frequency of the third signal. Such a synchronization circuit may be a delay-locked loop, a phase-locked loop, or an injection locking circuit.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings and examples which form a portion of the specification, in which:

FIG. 19 is a flow diagram illustrating an exemplary method in accordance with the teachings of the present invention.

Figure 1:
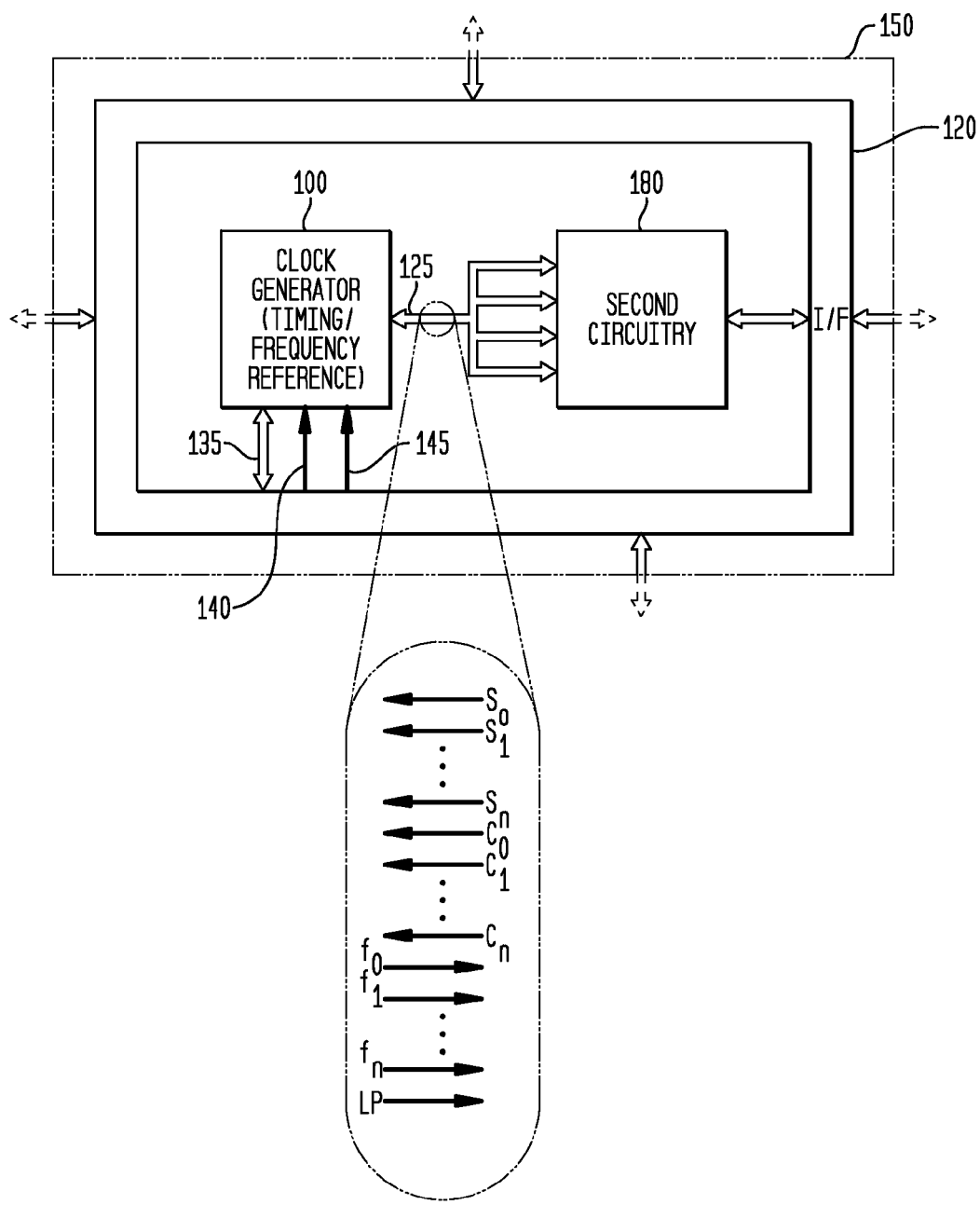
FIG. 1 is a block diagram illustrating an exemplary system embodiment in accordance with the teachings of the present invention.

DETAILED DESCRIPTION OF THE
EXEMPLARY EMBODIMENTS

While the present invention is susceptible of embodiment in many different forms, there are shown in the drawings and will be described herein in detail specific examples and embodiments thereof, with the understanding that the present disclosure is to be considered as an exemplification of the principles of the invention and is not intended to limit the invention to the specific examples and embodiments illustrated.

As indicated above, the various embodiments of the invention provide numerous advantages, including the ability to integrate a highly accurate (over PVT), low-jitter, free-running and self-referencing clock generator and/or a timing and frequency reference with other circuitry, such as illustrated in FIG. 1. FIG. 1 is a block diagram illustrating an exemplary system embodiment 150 in accordance with the teachings of the present invention. As illustrated in FIG. 1, the system 150 is a single integrated circuit, having a clock generator and/or timing/frequency reference 100 of the present invention integrated monolithically with other, or second, circuitry 180, together with interface (I/F) (or input/output (I/O) circuitry) 120. The interface 120 will generally provide power, such as from a power supply (not illustrated), ground, and other lines or busses to the clock generator 100, such as for calibration and frequency selection. As illustrated, one or more output clock signals are provided on bus 125, as a plurality of frequencies, such as a first frequency ($f_0$), a second frequency ($f_1$), and so on, through an $(n+1)^{th}$ frequency ($f_n$). In addition, a power conservation mode (or low power mode (LP)) is provided (also on bus 125). The second circuitry 180 (or the I/F 120) may also provide input into the clock generator 100, such as through selection signals ($S_0$, $S_1$, through $S_n$), and one or more calibration signals ($C_0$ through $C_n$). Alternatively, the selection signals ($S_0$, $S_1$, through $S_n$) and one or more calibration signals ($C_0$ through $C_n$) may be provided directly to the clock generator 100 through the interface 120, such as on bus 135, along with power (on line 140) and ground (on line 145).

The clock generator and/or timing/frequency reference 100, in addition to a low power mode, has additional modes discussed in greater detail below. For example, in a clock mode, the apparatus 100 will provide one or more clock signals, as output signals, to the second circuitry 180. The second circuitry 180 may be any type or kind of circuitry, such as a microprocessor, a digital signal processor ("DSP"), a radio-frequency circuit, for example, or any other circuit which could utilize the one or more output clock signals. Also for example, in a timing or frequency reference mode, the output signal from the apparatus 100 may be a reference signal, such as a reference signal for synchronization for a second oscillator. As a consequence, the terminology clock generator and/or timing/frequency reference will be utilized interchangeably herein, with the understanding that the clock generator will also generally provide a square-wave signal, which may or may not be provided with a timing/frequency reference, which may utilize a substantially sinusoidal signal instead. In addition, as discussed in greater detail below, the various embodiments of the invention also provided a pulsed mode, in which the output signal from clock generator and/or timing/frequency reference 100 is provided in bursts or intervals, for increased instruction processing efficiency and lower power consumption, for example.

Figure 15B:
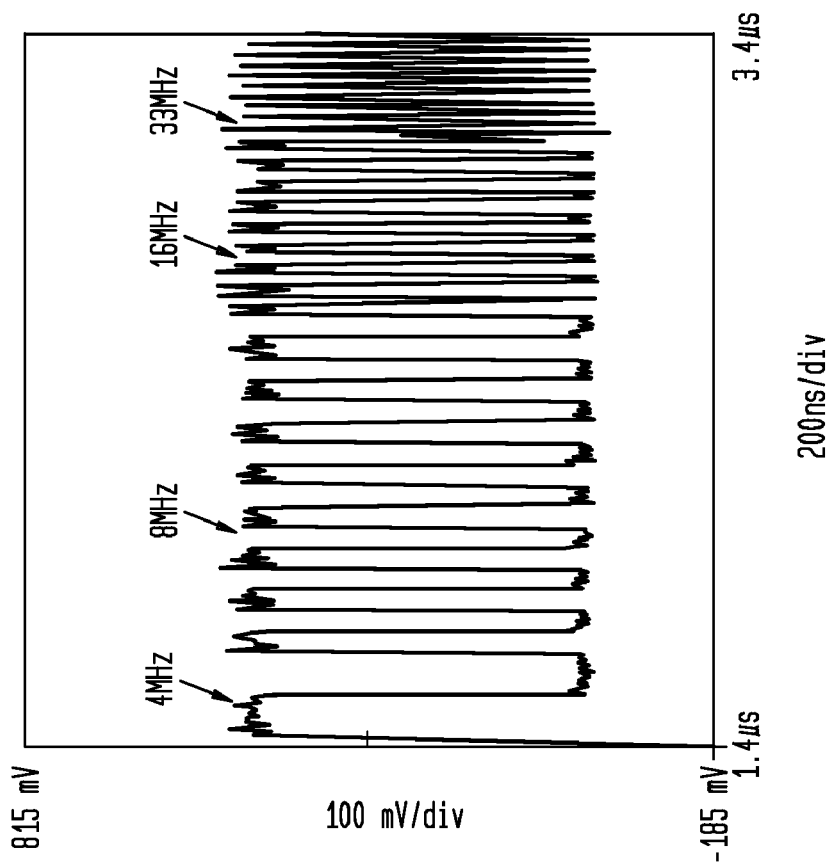
FIG. 15 is a graphical diagram illustrating exemplary low latency frequency switching in accordance with the teachings of the present invention.
Figure 15A:
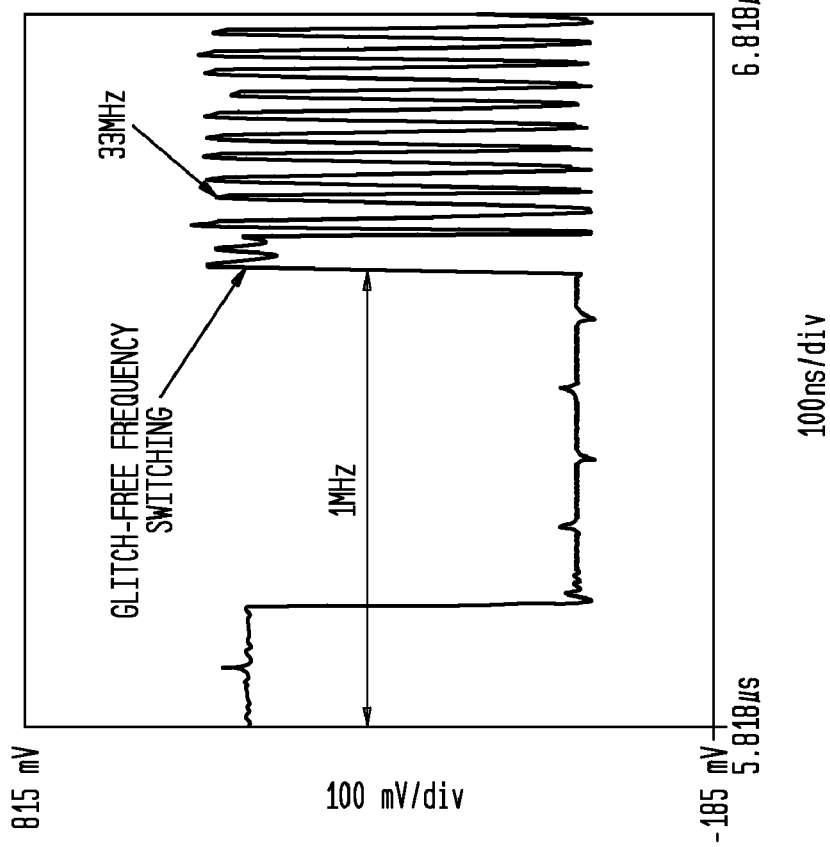

It should be noted that the various signals are referred to as "substantially" sinusoidal or square-wave, for example. This is to accommodate the various fluctuations, noise sources and other distortions introduced which may cause such signals to differ in practice from the more ideal depictions found in textbooks. For example, as discussed in greater detail below, exemplary "substantially" square-wave signals are depicted in FIGS. 15A and 15B, and exhibit a variety of distortions, such as undershoots, overshoots, and other variations, and are nonetheless considered to be very high quality square-waves in practice.

Several important features of the present invention are in system 150. First, a highly accurate, low-jitter, free-running and self-referencing clock generator 100 is integrated monolithically with other (second) circuitry 180, to form a singular integrated circuit (system 150). This is in sharp contrast with the prior art, in which a reference oscillator is used to provide a clock signal, such as a crystal reference oscillator, which cannot be integrated with other circuitry and is off-chip, as a second and separate device which must be connected through a circuit board to any additional circuitry. For example, in accordance with the present invention, the system 150, including clock generator 100, may be fabricated with other, second circuitry using conventional CMOS, BJT, BiCMOS, or other fabrication technologies utilized in modern IC manufacturing.

Second, no separate reference oscillator is required. Rather, in accordance with the invention, the clock generator 100 is self-referencing and free-running, such that it is not referenced to or locked to another signal, such as being synchronized in a phase locked loop ("PLL"), delay locked loop ("DLL"), or via injection locking to a reference signal, which is typical of the prior art.

Third, the clock generator 100 provides a plurality of output frequencies and a power conservation mode, such that frequencies may be switched with low latency and in a glitch-free manner. For example, second circuitry 180 may shift to a power conservation mode, such as a battery or lower frequency mode, and request (through selection signals) a lower clock frequency for minimizing power consumption, or request a low power clock signal to enter a sleep mode. As discussed in greater detail below, such frequency switching is provided with substantially negligible latency, with low latency introduced for glitch prevention (in proportion to the number of glitch prevention stages utilized), using a merely a handful of clock cycles, rather than the thousands of clock cycles required to change the output frequency from a PLL/DLL oscillator.

In addition, given the significantly high available output frequencies of the clock generator and/or timing/frequency reference 100 discussed below, new operating modes are available. For example, clock start-up times are effectively or substantially negligible, allowing the clock generator and/or timing/frequency reference 100 to be repeatedly started and stopped, such as turned off entirely or to be pulsed for power conservation. For example, rather than running continuously as a clock, the clock generator and/or timing/frequency reference 100 can be operated in comparatively short, discrete intervals or bursts (i.e., pulsed), periodically or non-periodically, for instruction processing by a second circuit 180, such as a processor. As discussed in greater detail below, with the rapid start-up time, such pulsed operation provides a power savings, as more instructions (million instructions per second or MIPS) are processed per milliwatt (mW) of power consumption. In addition, such a pulsed mode may also be utilized to periodically synchronize a second clock or oscillator, in addition to other uses. As a consequence, the clock generator and/or timing/frequency reference 100 (and the other embodiments discussed below) has a plurality of operating modes, including a clock mode, a timing and/or frequency reference mode, a power conservation mode, and a pulsed mode.

Fourth, as discussed in greater detail below, the clock generator and/or timing/frequency reference 100 includes features for highly accurate frequency generation over fabrication process, voltage, and temperature ("PVT") variations. These features include frequency tuning and selection, and compensation for frequency variations which may be caused due to temperature and/or voltage fluctuations and fabrication process variations.

Fifth, the clock generator and/or timing/frequency reference 100 generates a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and noise power reduced by $N^2$. As a consequence, the clock generator of the present invention results in significantly less jitter than available with other oscillators, such as ring oscillators.

Figure 2:
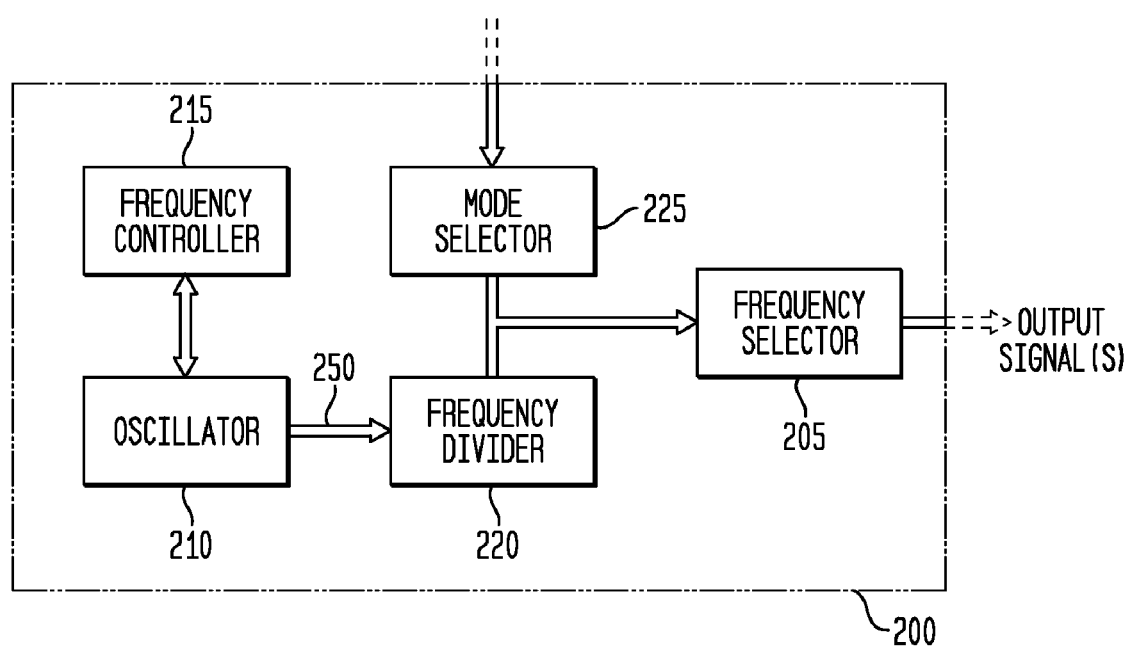
FIG. 2 is a block diagram illustrating a first exemplary apparatus embodiment in accordance with the teachings of the present invention.

These features are illustrated in greater detail in FIG. 2, which is a block diagram illustrating a first exemplary apparatus 200 embodiment in accordance with the teachings of the present invention. As illustrated in FIG. 2, the apparatus 200 is a clock generator and/or timing/frequency reference, providing one or more output signals, such as a clock or reference signal having any of a plurality of frequencies, selected using frequency selector 205. The apparatus (or clock generator) 200 includes an oscillator 210 (having a resonant element), a frequency controller 215, a frequency divider 220, a mode selector 225, and the frequency selector 205 mentioned above. In accordance with the invention, the oscillator 210 generates a signal having a comparatively high frequency, $f_0$. Due to PVT variations mentioned above, the frequency controller 215 is utilized to frequency select or tune the oscillator 210, such that the oscillation frequency $f_0$ is selectable from a plurality of potential oscillation frequencies, i.e., the frequency controller 215 provides for output signals having frequencies which are accurate over PVT variations.

For example, given these PVT variations, the output frequency from an oscillator, such as oscillator 210, may vary plus or minus 5%. For some applications, such as those utilizing ring oscillators, such frequency variability may be acceptable. In accordance with the present invention, however, greater accuracy for the clock generator 200 is desirable, particularly for more sensitive or complex applications, such as providing clock signals for integrated microprocessors, microcontrollers, digital signal processors, communication controllers, and so on. As a consequence, frequency controller 215 is utilized to adjust for these PVT variations, such that the output frequency from the oscillator is the selected or desired frequency $f_0$ with much less variance by several orders of magnitude, such as ±0.25% or less, and having a comparatively low-jitter.

To improve performance and decrease jitter (noise) and other interference, instead of generating a low frequency output and multiplying it up to a higher frequency, as is typically done using PLLs and DLLs, the present invention generates a comparatively high frequency output, $f_0$, which is then divided to one or more lower frequencies ($f_1$ through $f_n$), using frequency divider 220. Clock signals having one or more of the plurality of frequencies from frequency divider 220 may then be selected, using frequency selector 205. As indicated above, such frequency selection is provided glitch-free and with low latency, providing comparatively and significantly fast and glitch-free frequency switching. In addition, a plurality of operating modes are provided, using mode selector 225.

Figure 3:
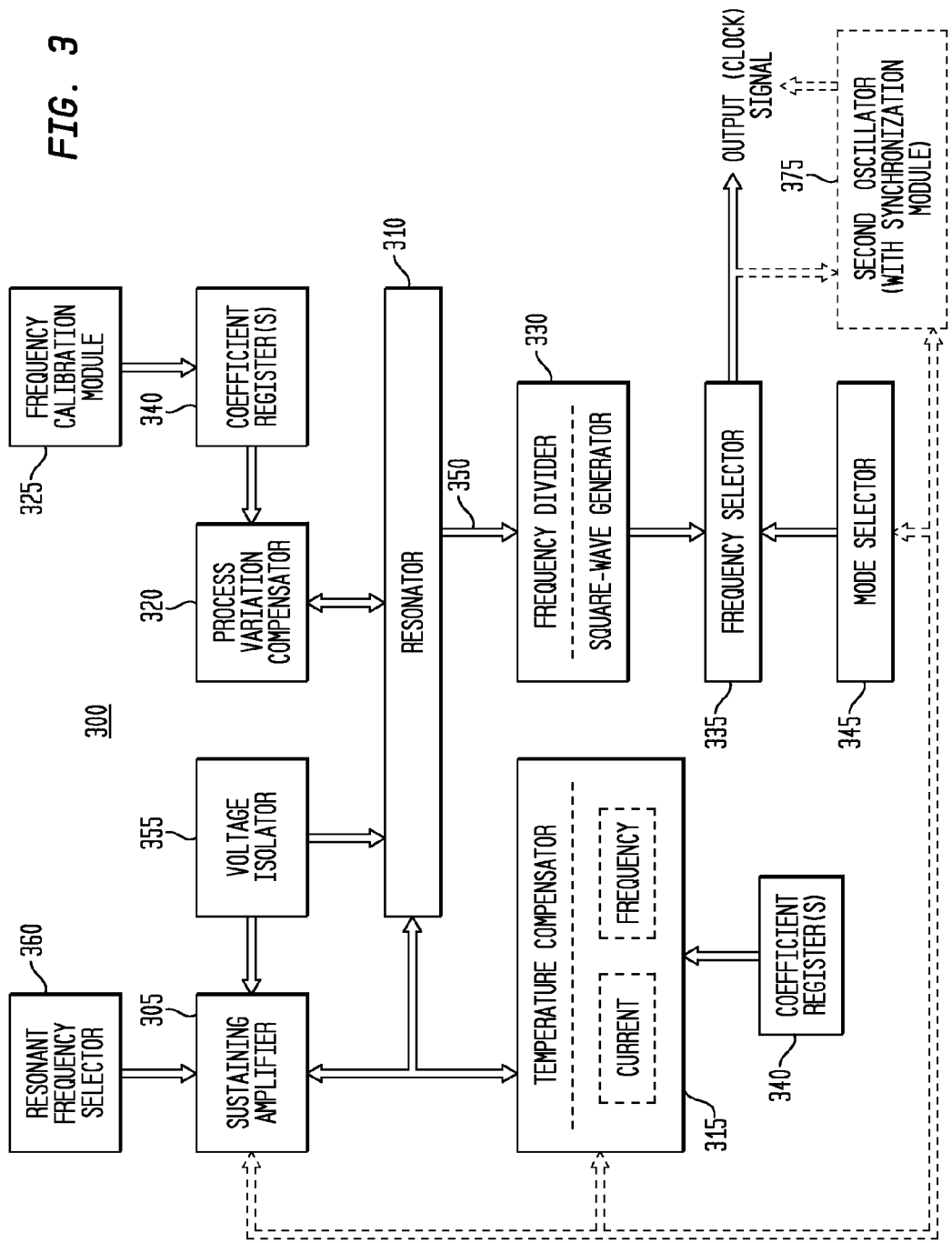
FIG. 3 is a block diagram illustrating a second exemplary apparatus embodiment in accordance with the teachings of the present invention.

FIG. 3 is a block diagram illustrating in greater detail a second exemplary apparatus embodiment, as clock generator and/or timing/frequency reference 300, in accordance with the teachings of the present invention. Referring to FIG. 3, clock generator and/or timing/frequency reference 300 comprises a resonator 310, a sustaining amplifier 305, a temperature compensator 315, a process variation compensator 320, a frequency calibration module 325, one or more coefficient registers 340, and depending on the selected embodiments, may also include a frequency divider and square wave generator 330, a voltage isolator 355, a resonant frequency selector 360, an output frequency selector 335 and mode selector 345. The sustaining amplifier 305, temperature compensator 315, process variation compensator 320, voltage isolator 355, resonant frequency selector 360, and frequency calibration module 325 are often included within a frequency controller, such as frequency controller 215. It should also be noted that the square-wave generator (of 330) may not be needed in timing or frequency reference embodiments.

The resonator 310 may be any type of resonator which stores energy, such as an inductor (L) and a capacitor (C) coupled to form an LC-tank, where the LC-tank has a selected configuration of a plurality of LC-tank configurations, or is otherwise electrically or electromechanically equivalent to or otherwise typically represented in the art as an inductor coupled to a capacitor. In addition to LC resonators, other resonators are considered equivalent and within the scope of the present invention; for example, the resonator 310 may be a ceramic resonator, a mechanical resonator (e.g., XTAL), a microelectromechanical ("MEMS") resonator, or a film bulk acoustic resonator. In other cases, various resonators may be represented by electrical or electromechanical analogy as LC resonators, and are also within the scope of the present invention. In exemplary embodiments, an LC-tank has been utilized as a resonator, to provide for a high Q-value.

The sustaining amplifier 305 provides for both start-up and sustaining amplification for the resonator 310. The temperature compensator 315 provides frequency control for the resonator 310, to adjust the oscillation frequency based on variations due to temperature. In selected embodiments, depending upon the degree of control desired or required, the temperature compensator 315 may include control over both current and frequency, as illustrated below for selected embodiments. Similarly, the process variation compensator 320 provides frequency control for the resonator 310, to adjust the oscillation frequency based on process variations inherent in semiconductor fabrication technologies, both process variations within a given foundry (e.g., batch or run variations, variations within a given wafer, and die-to-die variations within the same wafer) and process variations among different foundries and foundry processes (e.g., 130 nm and 90 nm processes). Frequency calibration module 325 is utilized to fine-tune and select the desired output frequency, $f_0$, from among the oscillation frequencies which may occur in resonator 310, i.e., to select the output frequency $f_0$ from a plurality of available or potential frequencies. In selected embodiments, coefficient registers 340 are utilized to store coefficient values utilized in the various exemplary compensator and calibration embodiments, discussed in greater detail below.

In addition to the temperature and process compensation, voltage isolator 355 provides isolation from variations in voltage, such as from a power supply, and may be implemented separately or as part of other components, such as part of temperature compensator 315. In addition to frequency adjustment for these PVT variations, the resonant frequency may also be selected independently through resonant frequency selector 360, for obtaining a selected frequency from a range of available frequencies.

For clock signal generation, clock generator 300 utilizes a frequency divider (in module 330) to convert the output oscillation frequency $f_0$ to a plurality of lower frequencies ($f_1$ through $f_n$) and to convert a substantially sinusoidal oscillation signal to a substantially square wave signal for clock applications, using a square wave generator (also in module 330). Frequency selector 335 then provides for selection of one or more of the available output signals having the plurality of frequencies, and mode selector 345 may also provide for operating mode selection, such as providing a low power mode, a pulsed mode, a reference mode, and so on. Using these components, the clock generator 300 provides a plurality of highly accurate (over PVT), low jitter, and stable output frequencies, $f_0$, $f_1$ through $f_n$, with minimal to negligible frequency drift due to such PVT variations, thereby providing sufficient accuracy and stability for sensitive or complex applications, as mentioned above.

Figure 4:
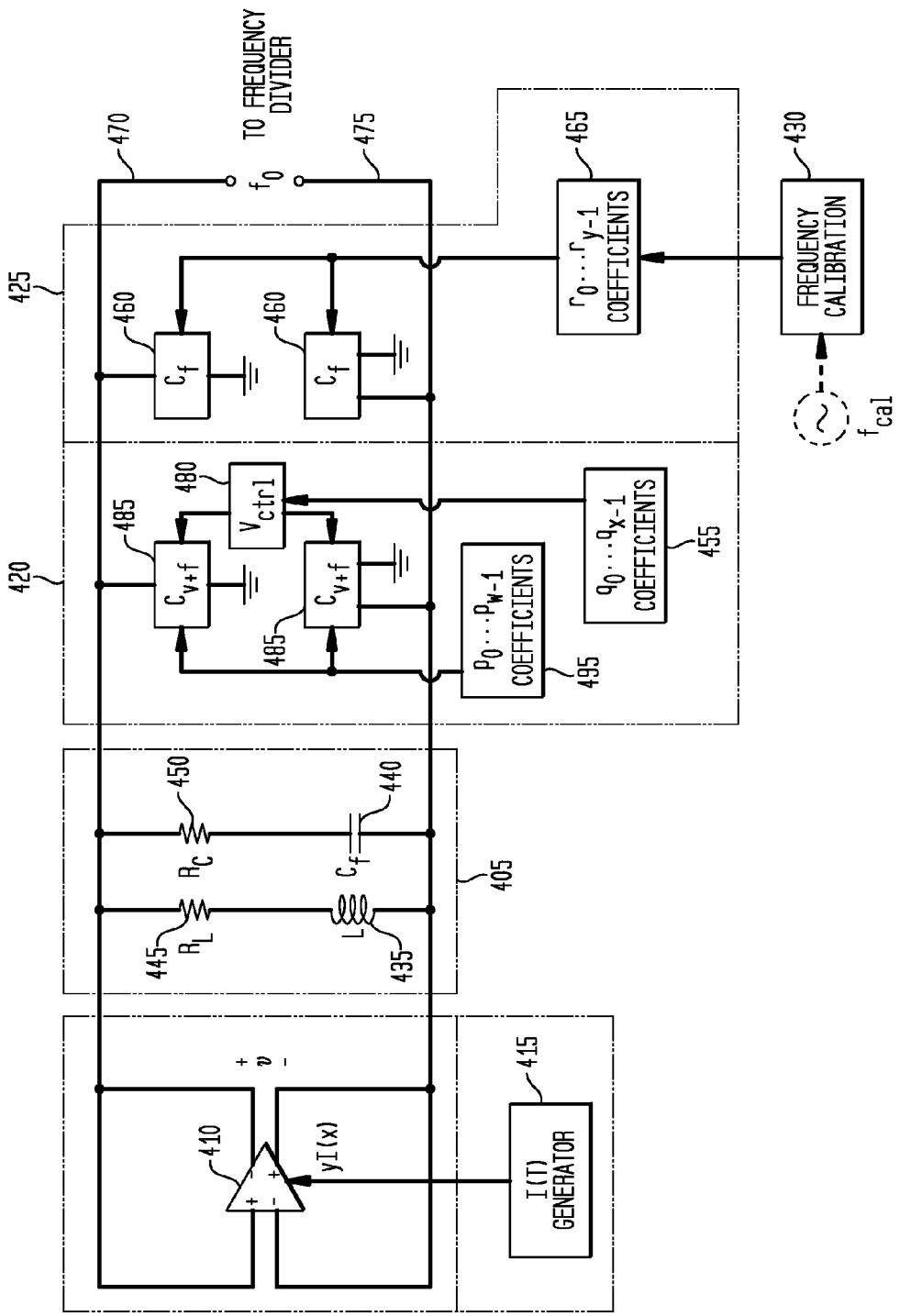
FIG. 4 is a high-level schematic and block diagram illustrating exemplary frequency controller, oscillator and frequency calibration embodiments in accordance with the teachings of the present invention.

FIG. 4 is a high-level schematic and block diagram illustrating exemplary frequency controller, oscillator and frequency calibration embodiments in accordance with the teachings of the present invention. As illustrated in FIG. 4, the resonator is embodied as a resonant LC tank 405, and the frequency controller is embodied as several elements, a negative transconductance amplifier 410 (used to implement the sustaining amplifier), a temperature-responsive (or temperature-dependent) current generator (I(T)) 415, a temperature-responsive (or temperature-dependent) frequency ($f_0$(T)) compensation module 420, a process variation compensation module 425, and may also include a frequency calibration module 430. The various temperature-responsive or temperature-dependent modules 415 and 420 are sensitive to or responsive to temperature fluctuations, and provide corresponding adjustments, such that the resonant frequency is accurate over these PVT variations.

Figure 8:
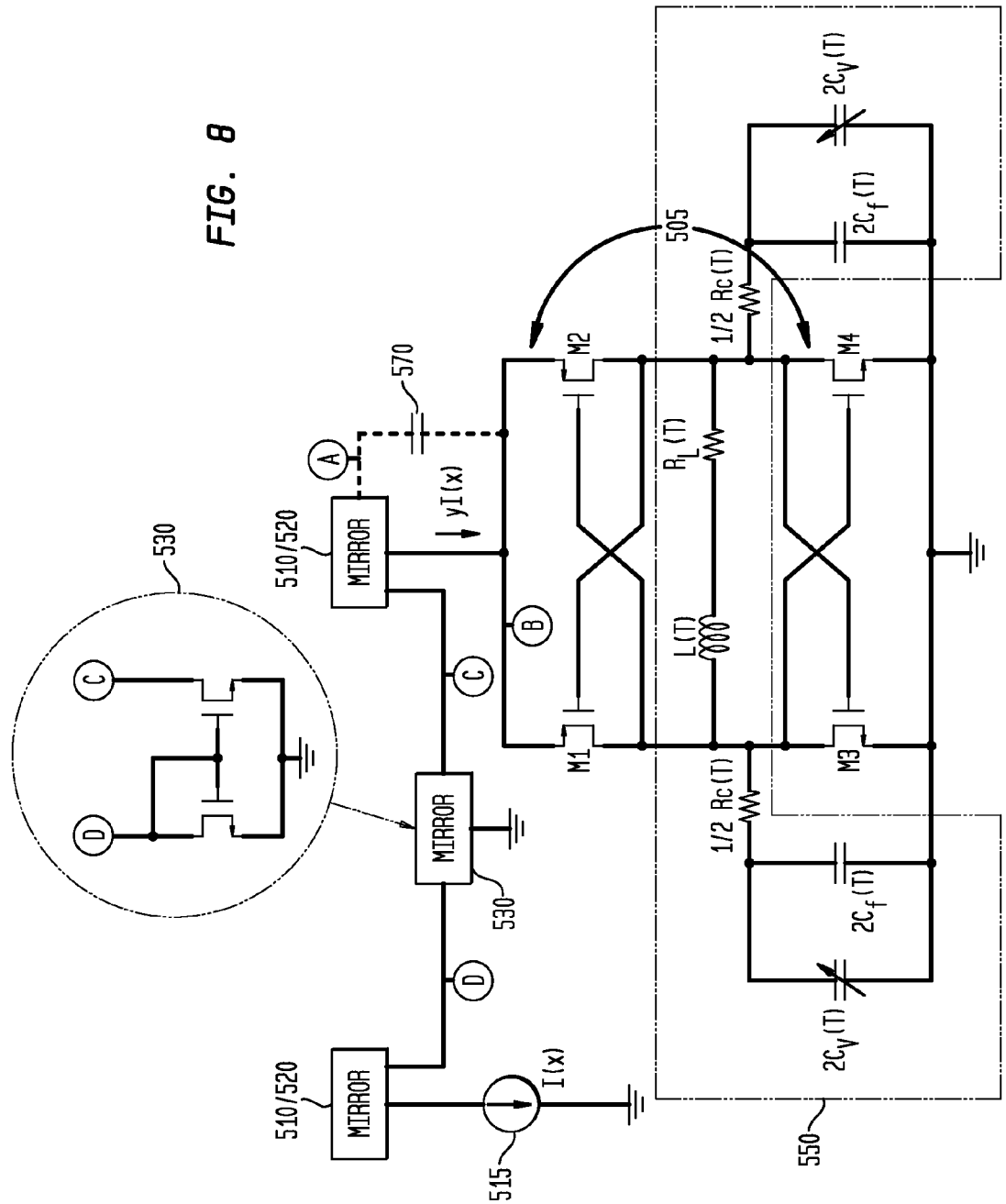
FIG. 8 is a circuit and block diagram illustrating second exemplary negative transconductance amplifier, temperature-responsive current generator (I(T)), and LC tank oscillator embodiments in accordance with the teachings of the present invention.

The resonant LC tank 405 with a sustaining amplifier may be equally described as a harmonic oscillator or harmonic core, and all such variations are within the scope of the present invention. It should be noted that while the resonant LC tank 405 is an inductor 435 in parallel with a capacitor 440, other circuit topologies are also known and equivalent to that illustrated, such as an inductance in series with a capacitance. Another such equivalent topology is illustrated in FIG. 8. In addition, as indicated above, other types of resonators may be utilized and all are considered equivalent to the exemplary resonant LC tank illustrated herein. Moreover, as discussed in greater detail below, additional capacitances, both fixed and variable, are distributed in the various modules and effectively form part of the resonant LC tank 405. In addition, corresponding resistances (or impedances) $R_L$ 445 and $R_C$ 450 are illustrated separately, but should be understood to be intrinsic to the inductor 435 and capacitor 440, respectively, occurring as part of fabrication, and are not additional or separate components from the respective inductor 435 and capacitor 440. Conversely, such resistances can also be included as part of compensation for PVT variations.

The inductor 435 and capacitor 440 of the resonant LC tank or oscillator 405 are sized to substantially or approximately provide the selected oscillation frequency, $f_0$, or range of oscillation frequencies around $f_0$. In addition, inductor 435 and capacitor 440 may be sized to have or to meet IC layout area requirements, with higher frequencies requiring less area. Those of skill in the art will recognize that $f_0 = 1/2\pi\sqrt{LC}$, but only as a first order approximation because, as discussed below, other factors such as the impedances $R_L$ and $R_C$, along with temperature and process variations and other distortions, affect $f_0$. For example, the inductor 435 and capacitor 440 may be sized to generate a resonant frequency in the 1-5 GHz range; in other embodiments, higher or lower frequencies may be desirable, and all such frequencies are within the scope of the invention. In addition, the inductor 435 and capacitor 440 may be fabricated using any semiconductor or other circuitry process technology, and may be CMOS-compatible, bipolar-junction transistor-compatible, for example, while in other embodiments, the inductor 435 and capacitor 440 may be fabricated using silicon-on-insulator (SOI), metal-insulator-metal (MiM), polysilicon-insulator-polysilicon (PiP), GaAs, strained-silicon, semiconductor heterojunction technologies, or MEMS-based (microelectromechanical) technologies, also for example and without limitation. It should be understood that all such implementations and embodiments are within the scope of the invention. In addition, other resonator and/or oscillator embodiments, in addition to or instead of the resonant LC tank 405, may also be utilized and are also within the scope of the present invention. As used herein, "LC tank" will mean and refer to any and all inductor and capacitor circuit layouts, configurations or topologies which may provide oscillation, however embodied. It should be noted that the capability of the oscillator 405 to be fabricated using a conventional process, such as CMOS technology, allows the clock generator to be fabricated integrally and monolithically with other circuitry, such as the second circuitry 180, and provides a distinct advantage of the present invention.

In addition, the capacitance 440 illustrated in FIG. 4 is only a portion of the overall capacitance involved in the resonance and frequency determination of the resonant LC tank 405, and is a fixed capacitance. In selected embodiments, this fixed capacitance may represent approximately 10% to 90% of the total capacitance ultimately utilized in the oscillator, as an example. As discussed in greater detail below, the overall capacitance is distributed, such that additional fixed and variable capacitance is selectively included within the clock generator and/or timing/frequency reference 300, and is provided, for example, by temperature-responsive frequency ($f_0$ (T)) compensation module 420 and process variation compensation module 425, to provide for both selecting the resonant frequency $f_0$ and to allow the resonant frequency $f_0$ to be substantially independent of both temperature and process variations.

In the selected embodiments, the inductance 435 has been fixed, but also could be implemented in a variable manner, or as a combination of fixed and variable inductances. As a consequence, those of skill in the art will recognize that the detailed discussions of fixed and variable capacitance, for both frequency tuning and temperature and process independence, pertain similarly to inductance choices. For example, different inductances could be switched in or out of the oscillator, to similarly provide tuning. In addition, a single inductor's inductance may also be modulated. As a consequence, all such inductance and capacitance variations are within the scope of the present invention.

Also as illustrated in FIG. 4, the resonant LC tank 405 and resulting output signal, referred to as a first (output) signal at nodes or lines 470 and 475, is a differential signal and provides common-mode rejection. Other configurations, including non-differential or other single-ended configurations are also within the scope of the present invention. For example, in single-ended configurations, only one instantiation of the various modules (e.g., 485, 460) would be required, rather than the use of two for a balanced configuration as illustrated. Similarly, other components and features discussed below, such as frequency dividers, would also have a single-ended rather than differential configuration. In addition, various embodiments illustrated utilize MOSFET transistors in various forms (such as CMOS, AMOS, IMOS, and so on); other implementations are also available, such as using bipolar junction transistors ("BJTs"), BiCMOS, etc. All such embodiments are considered equivalent and are within the scope of the present invention.

Figure 5A:
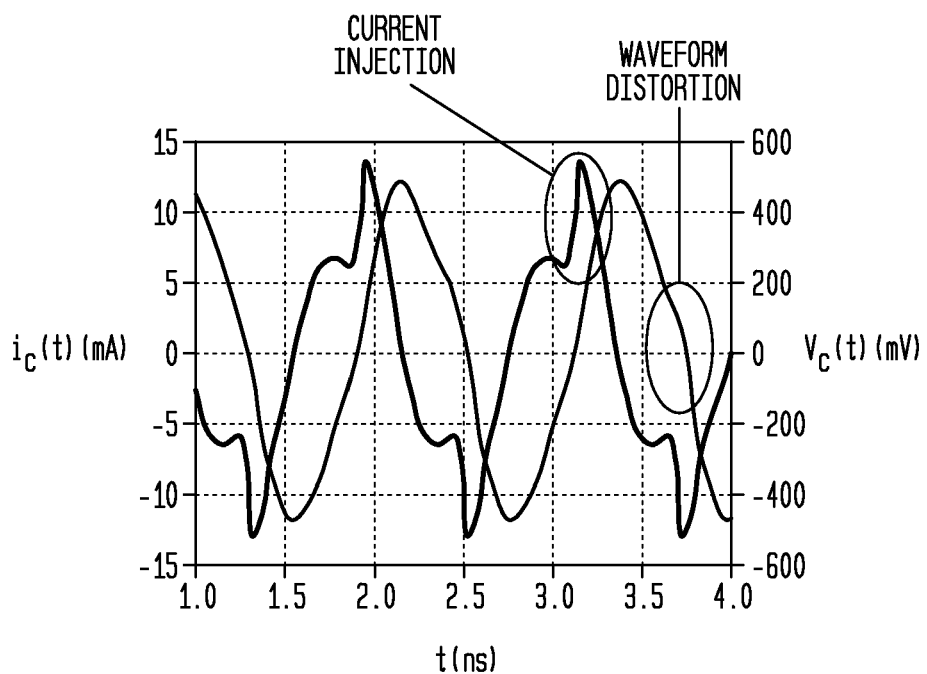
FIG. 5A is an exemplary graph illustrating oscillator voltage waveform (frequency) distortion with current injection into an oscillator.
Figure 5B:
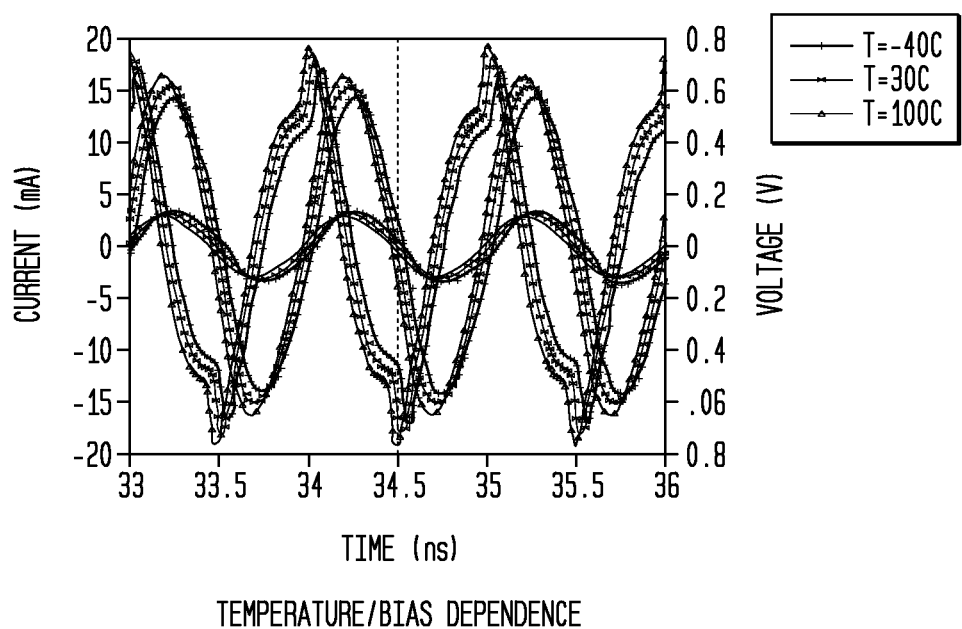
FIG. 5B is an exemplary graph illustrating oscillator voltage waveform (frequency) distortion or variation with temperature.
Figure 5C:
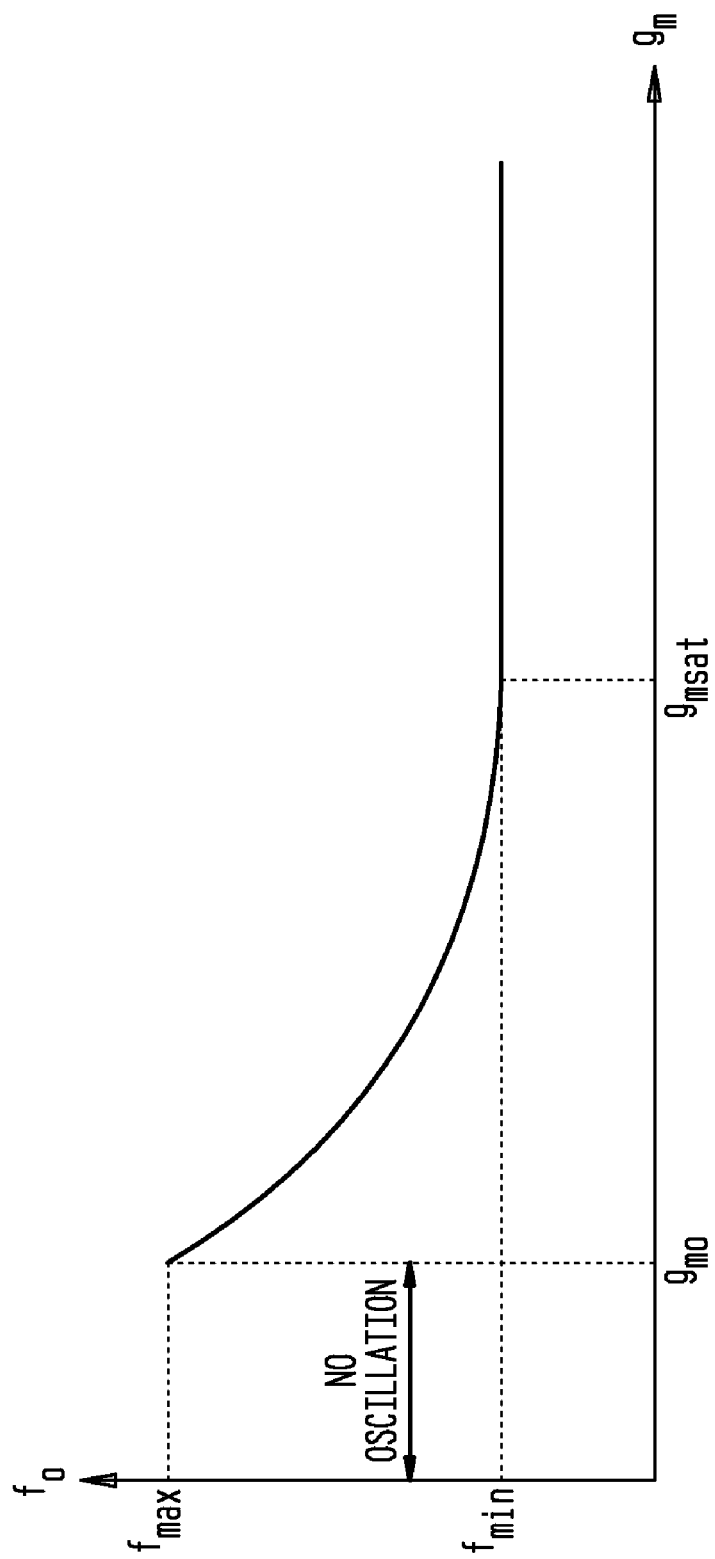
FIG. 5C is an exemplary graph illustrating oscillator frequency as a function of the transconductance of a sustaining amplifier.

The negative transconductance amplifier 410 is selected to provide temperature compensation through transconductance ($g_m$) modulation and the on-resistance of its resistors. Transconductance ($g_m$) modulation may also be utilized independently in frequency selection. Another significant advantage of the present invention is the selection of a negative transconductance amplifier 410 to provide start-up and sustaining amplification, because both oscillation amplitude and frequency are affected by the transconductance of the sustaining amplifier, providing both amplitude modulation and frequency trimming (or tuning), in addition to providing temperature compensation. The negative transconductance amplifier 410 will inject current into the resonant LC tank 405 (and specifically onto the capacitor 440) in response to a voltage across the resonant LC tank 405, as illustrated (across nodes 470 and 475). That current injection, in turn, will change (and distort) the voltage waveform (as voltage is the integral of the current), resulting in a change or variation in frequency, generally in inverse proportion to the magnitude of the transconductance, $g_m$, as illustrated in FIG. 5A. It should be noted that this transconductance is a negative value, as gain is provided to cancel the loss intrinsic to the resonant element. As a consequence, whenever "transconductance amplifier" is utilized herein, it should be understood to mean and to be merely an abbreviation for "negative transconductance amplifier". In turn, the transconductance is also a function of the bias current, substantially proportional (approximately) to the square root of the current (yI(x)) through the amplifier 410 (for MOSFETs), and substantially proportional (approximately) to the current (yI(x)) through the amplifier 410 (for BJTs), which is temperature-dependent, resulting in a waveform distortion which is both temperature and current-bias dependent, as illustrated in FIG. 5B. In addition, as illustrated in FIG. 5C, the oscillation frequency is also related to and a function of the transconductance of the sustaining negative transconductance amplifier 410, providing for oscillation frequency selection. Moreover, in addition to temperature dependence (as I(T)), the current can also vary as a function of other variables (as I(x)), such as voltage or external tuning, may also be amplified such as by a factor of "y" (as illustrated below), and as a consequence, the current is referred to as "yI(x)".

Significant inventive breakthroughs of the present invention include utilizing these potential distortions advantageously, to provide for frequency compensation in generating the selected $f_0$ value of the oscillator, and frequency modulation through modulation of the transconductance of the sustaining amplifier. As a consequence, and as discussed in greater detail below, the transconductance, first, may be modified or varied for frequency selection, and second, to compensate for such frequency variation due to temperature or voltage, by modifying the current yI(x), generally on a real-time or near real-time basis. The selected frequency $f_0$, and its stability with respect to temperature variations, in accordance with the invention, may be determined through appropriate selection of the transconductance $g^m$ and selection of I(T). Stated another way, in accordance with the present invention, the bias current is made temperature dependent, as I(T) (or, more generally, as yI(x)), which in turn affects the transconductance $g_m$, which in turn affects the oscillation frequency $f_0$. This methodology may also be utilized for other variables, such as voltage fluctuations.

Figure 6:
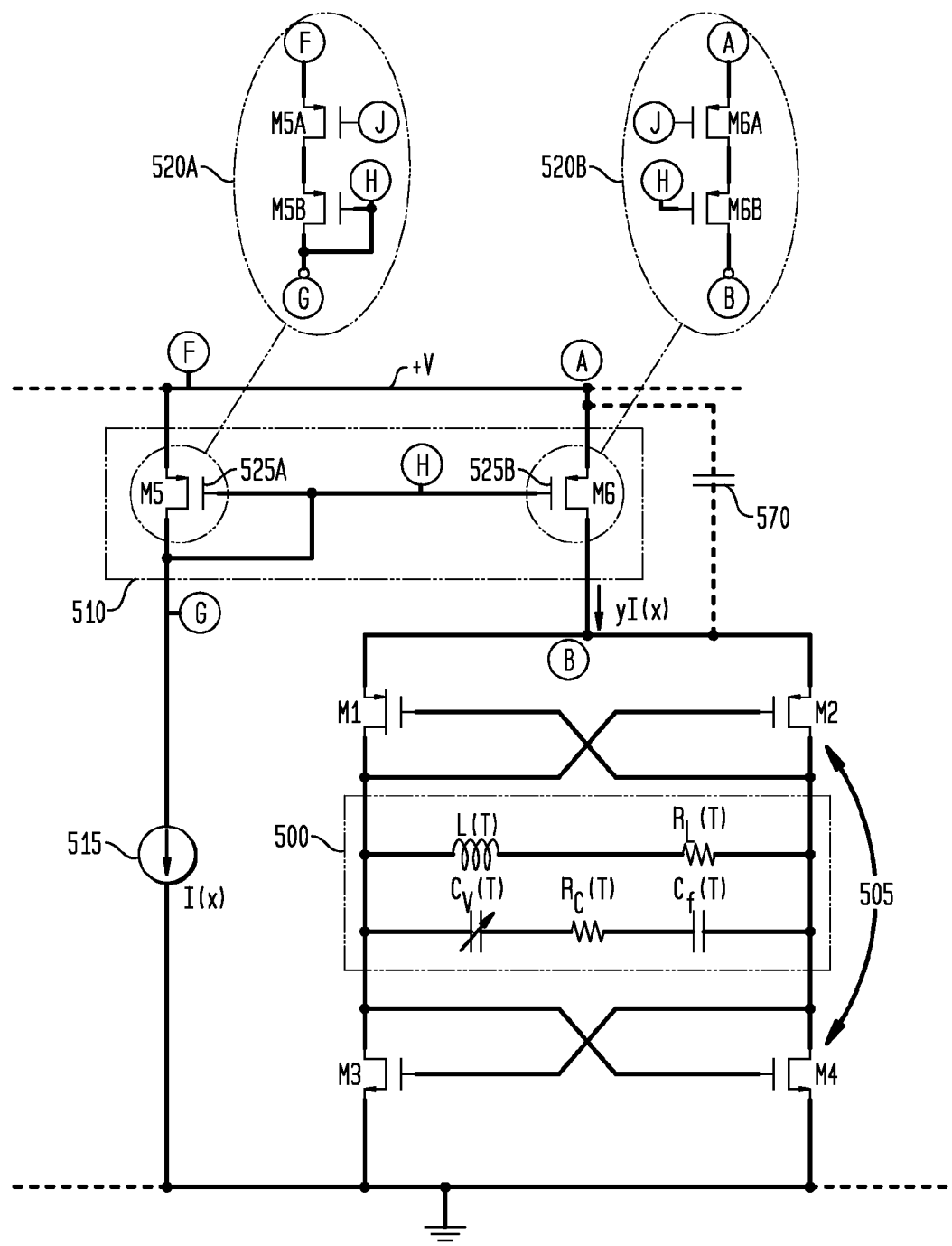
FIG. 6 is a circuit diagram illustrating first exemplary negative transconductance amplifier, temperature-responsive current generator (I(T)), and LC tank oscillator embodiments in accordance with the teachings of the present invention.
Figure 7A:
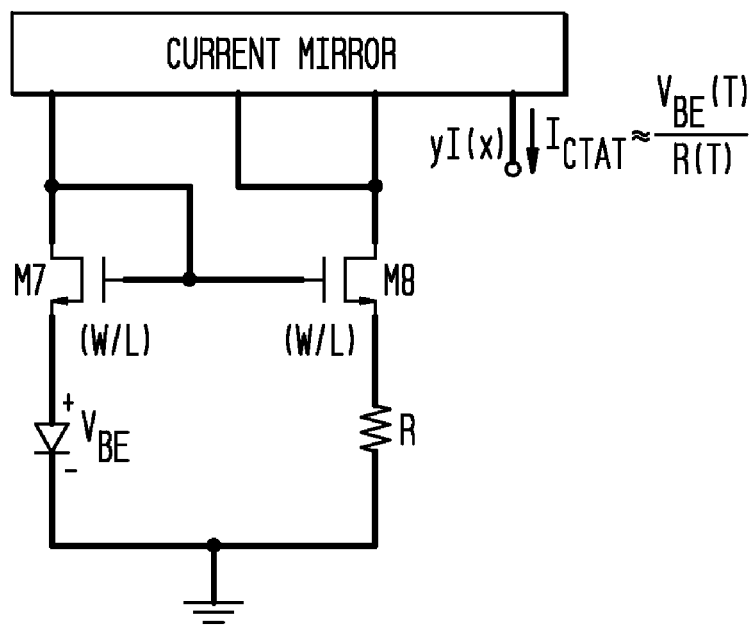
FIG. 7A is a circuit diagram illustrating an exemplary temperature-responsive CTAT current generator in accordance with the teachings of the present invention.
Figure 7B:
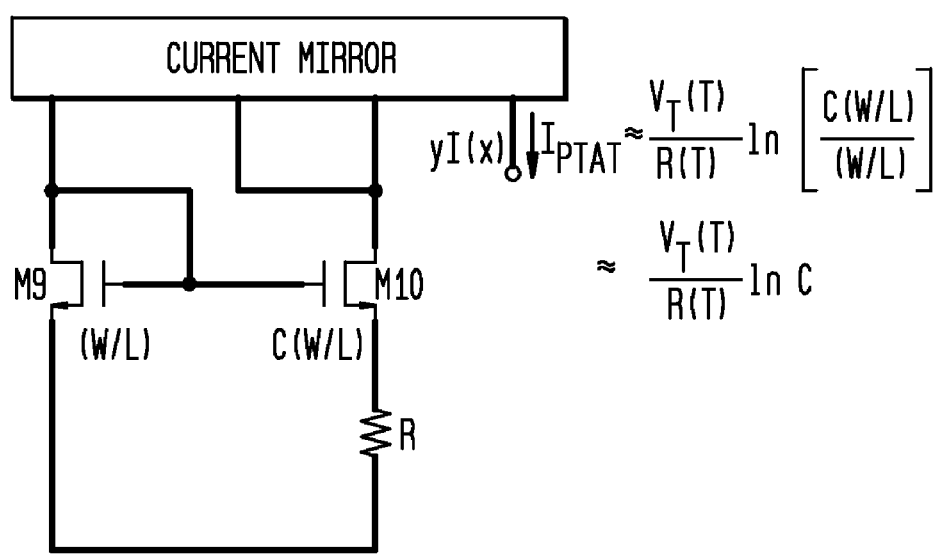
FIG. 7B is a circuit diagram illustrating an exemplary temperature-responsive PTAT current generator in accordance with the teachings of the present invention.
Figure 7C:
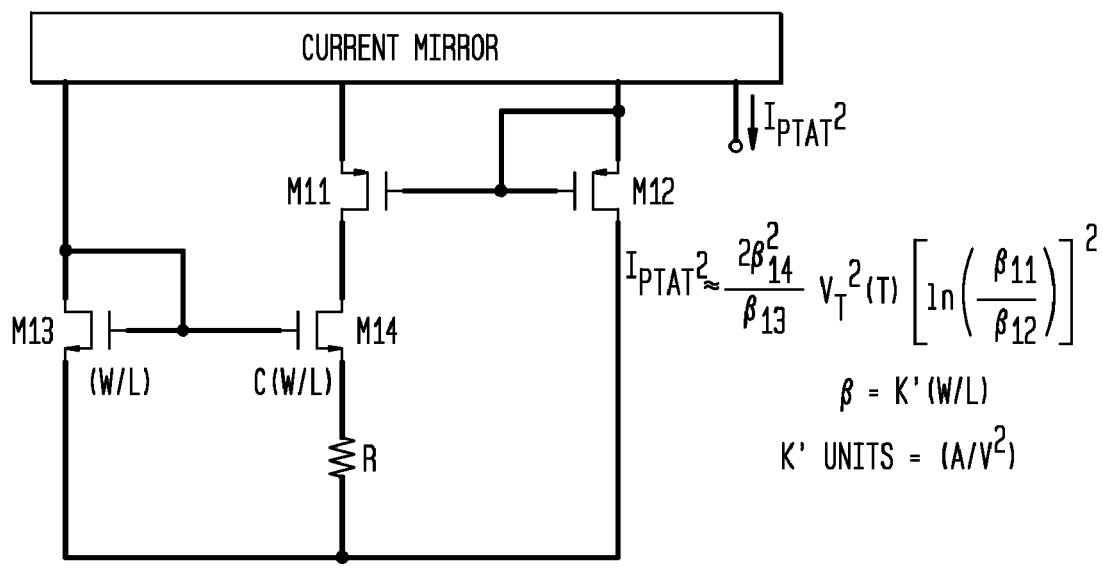
FIG. 7C is a circuit diagram illustrating an exemplary temperature-responsive $PTAT^2$ current generator in accordance with the teachings of the present invention.
Figure 7D:
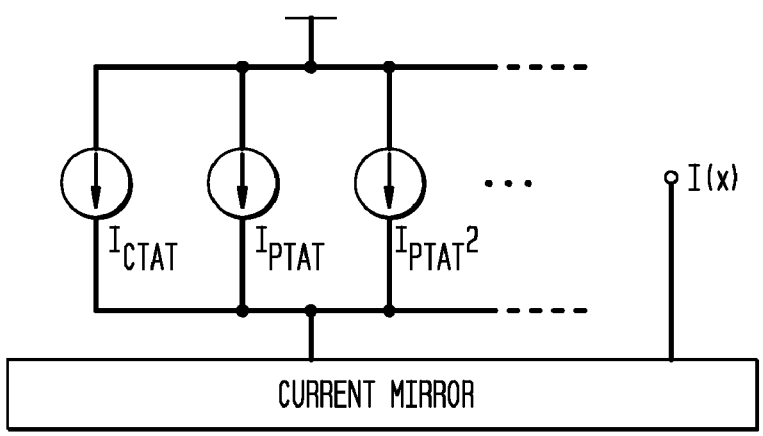
FIG. 7D is a circuit diagram illustrating an exemplary temperature-responsive current generator, with selected CTAT, PTAT, and $PTAT^2$ configurations, in accordance with the teachings of the present invention.

FIG. 6 is a circuit diagram illustrating exemplary negative transconductance amplifier, temperature-responsive current generator (I(T)), and LC tank resonator embodiments in accordance with the teachings of the present invention. As illustrated in FIG. 6, the resonant LC tank 500 is coupled to a negative transconductance amplifier implemented as a complementary cross-coupled pair amplifier 505 (comprised of transistors M1, M2, M3 and M4) which, in turn, is coupled through a voltage isolator, implemented as current mirror 510 (transistors 525A and 525B), to a temperature-responsive current generator (I(x)) 515. The current mirror 510 may also be implemented in a cascode topology (520A and 520B), such as to provide improved stability with variations in power supply and isolate the oscillator from the power supply (voltage isolation). The temperature-responsive current generator 515 may be implemented utilizing topologies such as CTAT (complementary to absolute temperature), PTAT (proportional to absolute temperature), or $PTAT^2$ (proportional to absolute temperature squared), as illustrated in FIGS. 7A, 7B and 7C, respectively, and combinations of CTAT, PTAT and $PTAT^2$, as illustrated in FIG. 7D. In each case, the current I(T) (or yI(x)) injected into the negative transconductance amplifier (complementary cross-coupled pair amplifier) 505 has a temperature dependence, such as increasing current (PTAT and $PTAT^2$) or decreasing current (CTAT) as a function of increasing temperature, as illustrated. One or more combinations of these temperature-responsive current generators may also be implemented, as illustrated in FIG. 7D, such as CTAT in parallel with PTAT, for example.

The selection of a particular temperature-responsive or temperature-dependent current generator is also a function of the fabrication process utilized; for example, CTAT may be utilized for a Taiwan Semiconductor (TSMC) fabrication process. More generally, as different fabricators utilize different materials, such as aluminum or copper, $R_L$ typically varies, resulting in different temperature coefficients which, in turn, change the temperature coefficient of the oscillator, thereby requiring differences in I(T) compensation. Correspondingly, different ratios of CTAT, PTAT, and $PTAT^2$ compensation may be required to provide an effectively flat frequency response as a function of temperature. Not separately illustrated, the various temperature-responsive current generators illustrated in FIGS. 7A, 7B, 7C and 7D may include a start-up circuit, which may be implemented as known in the art. In addition, the transistors comprising the selected temperature-responsive current generator configuration may be biased differently, such as biased in strong inversion for CTAT (M7 and M8) and $PTAT^2$ (M13 and M14), and in subthreshold for PTAT (M9 and M10) and $PTAT^2$ (M11 and M12), for the exemplary topologies illustrated.

FIG. 8 is a circuit and block diagram illustrating additional exemplary negative transconductance amplifier, temperature-responsive (or temperature-dependent) current generator (I(T) or I(x)), and LC tank oscillator embodiments in accordance with the teachings of the present invention. As illustrated in FIG. 8, the resonant LC tank 550 has a different topology than previously illustrated, but also is coupled to a negative transconductance amplifier implemented as a complementary cross-coupled pair amplifier 505 (transistors M1, M2, M3 and M4) which, in turn, is coupled through a plurality of current mirrors 510 (or 520) and 530 to a temperature-responsive (or temperature-dependent) current generator (I(T) or I(x)) 515. As illustrated, the plurality of current mirrors are utilized to successively provide gain to and increase the current I(T) entering the negative transconductance amplifier 505 and resonant LC tank 550. Often, the tail device in the current mirror (e.g., transistor M6 in FIG. 6) providing current into node B and which drives the negative transconductance amplifier is selected to be a PMOS device, and thus several stages of mirroring may be required (as shown) to provide a PMOS current mirror input to the $g_m$ amplifier. PMOS is often selected because in modern CMOS processes, PMOS devices are often buried channel devices which are known to exhibit less flicker noise than equally sized and similarly biased NMOS devices. Reduced flicker noise in the tail device reduces the phase noise and jitter of the oscillator because flicker noise is upconverted around the oscillation frequency by the nonlinear active devices in the circuit.

As indicated above, the portion of the current mirror 510 or 520 (or other circuitry) sourcing current into the negative transconductance amplifier 505 should have a high impedance at its output to reduce power supply frequency drift, such as by using long transistor geometries and cascode configurations to increase output resistance, and provide significant stability at node B. In addition, a shunt capacitor 570 also may be employed to filter and thereby reduce flicker noise from the various tail devices.

Depending upon the selected application, the use of the negative transconductance amplifier 505 with its I(T) (or yI(x)) bias may provide sufficient frequency stability, such that the additional frequency controller components may not be necessary or desirable in that application. In other embodiments, however, additional accuracy and less frequency drift may be provided, using one or more of the components discussed in greater detail below.

In addition to providing a temperature-dependent current yI(x) (or I(T)), the various transistors M1, M2, M3 and M4 each have an associated resistance during conduction, which may also tend to cause frequency distortion and frequency drift during oscillation. In each half-cycle, either M1 and M4 or M2 and M3 are on and conducting. Such resistance is also temperature dependent. As a consequence, the transistors M1, M2, M3 and M4 should be adjusted in size (width and length) to also compensate for such frequency effects. It should be noted that the current injected into the resonant LC tank 405 must be sufficient to sustain oscillation (as illustrated in FIG. 5C) and, as a consequence, will have a minimum value, which may limit the degree or capability of frequency control which can be readily implemented through the negative transconductance amplifier 410 (or 505) and temperature-dependent current generator 415 (or 515). As a consequence, I(T) and the transistor (M1, M2, M3 and M4) sizing should be jointly selected to provide for oscillation start up, to accommodate maximum currents for power consumption constraints, and to fit into the selected IC area and layout. For example, the transconductance $g_m$ may be selected to provide approximately sufficient current to ensure start up and sustain oscillation, with a frequency characteristic of decreasing frequency with increasing temperature, followed by sizing transistors M1, M2, M3 and M4 to be large enough to either make the frequency independent of temperature or increasing with increasing temperature, followed by fine-tuning the frequency-temperature relationship with appropriate selection of I(T). In selected modeled embodiments, this has resulted in frequency accuracy of approximately ±0.25% to 0.5% over PVT, which may be more than sufficient for many applications.

Referring again to FIG. 4, additional compensation modules are also utilized to provide greater control and accuracy over the resonant frequency $f_0$, such as for applications in which greater accuracy and less variance (or frequency drift) may be required, or where technologies do not allow the previous techniques to provide sufficient accuracy over PVT variations, such as to provide a frequency accuracy of approximately ±0.25% or better. In these circumstances, temperature-dependent (or temperature-responsive) frequency ($f_0(T)$) compensation module 420 may be utilized, such as the exemplary temperature-responsive frequency ($f_0(T)$) compensation module 420. This module 420 may be implemented, for example, utilizing controllable capacitance modules 485, with each coupled to a respective side or rail of the resonant LC tank 405 (lines 470 and 475), and with each under common control, provided by a first plurality ("w") of switching coefficients ($p_0$ though $p_{(w-1)}$) (register 495) and a voltage controller ($V_{CTRL}$) 480 providing a control voltage determined by a second plurality ("x") of switching coefficients ($q_0$ though $q_{(x-1)}$) (register 455), with representative examples illustrated in FIGS. 9 and 10.

Figure 9:
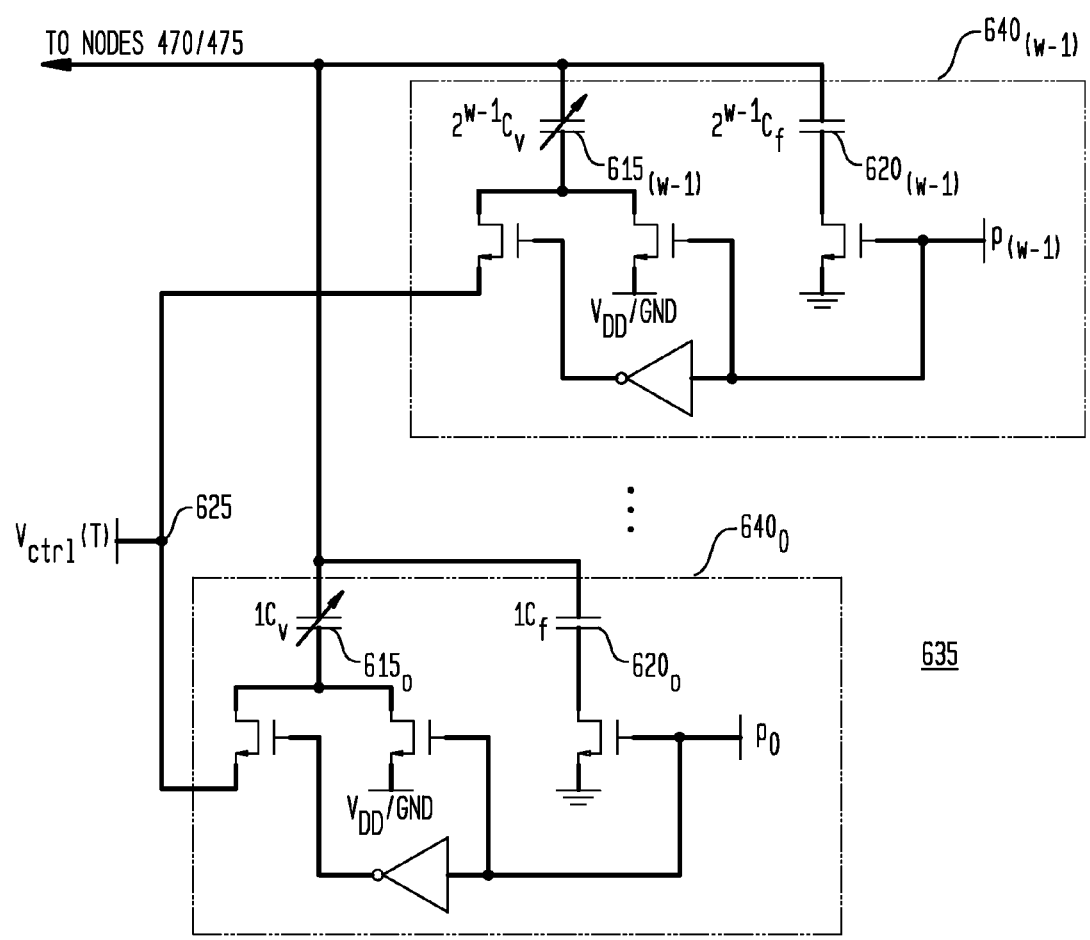
FIG. 9 is a circuit diagram illustrating an exemplary controlled capacitor module utilized in a frequency-temperature compensation module in accordance with the teachings of the present invention.

FIG. 9 is a circuit diagram illustrating an exemplary controllable capacitance module 635 in accordance with the teachings of the present invention, which may be utilized as the controllable capacitance modules 485 in the frequency-temperature compensation module 420 (and attached to each side of the resonant LC tank 405 (nodes or lines 470 and 475)). As illustrated, the controllable capacitance module 635 is comprised of a bank or array of a plurality (w) of switchable capacitive modules 640 of binary-weighted fixed capacitors ($C_f$) 620 and variable capacitors (varactors) ($C_v$) 615. Any type of fixed capacitors 620 and variable capacitors (varactors) 615 may be utilized; in selected embodiments, the varactors 615 are A-MOS (accumulation mode MOSFET), I-MOS (inversion mode MOSFET), and/or junction/diode varactors. Each switchable capacitive module 640 has an identical circuit layout, and each differs by a binary weighted capacitance, with switchable capacitive module 640$_0$ having a capacitance of one unit, switchable capacitive module 640$_1$ having a capacitance of two units, and so on, with switchable capacitive module 640$_{(w-1)}$ having a capacitance of $2^{(w-1)}$ units, with each unit representing a particular capacitance value (typically in femtofarads (fF) or picofarads (pF)).

Within each switchable module 640, each fixed and variable capacitance is initially equal, with the variable capacitance allowed to vary in response to the control voltage provided at node 625. This control voltage, in turn, varies with temperature, resulting in an overall or total capacitance provided by the controlled capacitor module 635 also varying as a function of temperature and which, in turn, is utilized to vary the resonant frequency $f_0$. Also within each switchable capacitive module 640, either the fixed capacitance $C_f$ or the variable capacitance $C_v$ is switched into the circuit, not both, using switching coefficients $p_0$ though $p_{(w-1)}$. For example, in the selected embodiment, for a given or selected module 640, when its corresponding "p" coefficient is a logic high (or high voltage), the corresponding fixed capacitance $C_f$ is switched into the circuit and the corresponding variable capacitance $C_v$ is switched out of the circuit (and coupled to a power rail $V_{DD}$ or ground (GND), depending whether the device is AMOS or IMOS, respectively, to avoid a floating node and to minimize the capacitance presented to the tank), and when its corresponding "p" coefficient is a logic low (or low voltage), the corresponding fixed capacitance $C_f$ is switched out of the circuit and the corresponding variable capacitance $C_v$ is switched into the circuit and coupled to the control voltage provided on node 625.

In an exemplary embodiment, a total of eight switchable capacitive module 640 (and corresponding first plurality of eight switching coefficients $p_0$ though $p_7$ have been implemented to provide 256 combinations of fixed and variable capacitances. As a result, significant control over oscillation frequency as a function of temperature variations is provided.

Figure 10:
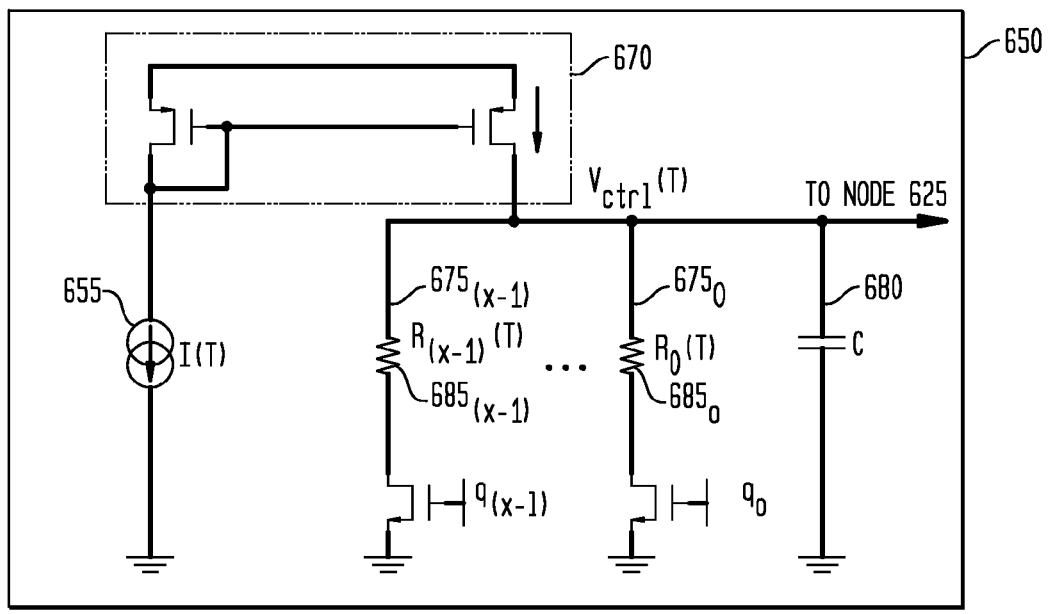
FIG. 10 is a circuit diagram illustrating an exemplary voltage control module 650 utilized in a frequency-temperature compensation module in accordance with the teachings of the present invention.

FIG. 10 is a circuit diagram illustrating an exemplary temperature dependent voltage control module 650 utilized to provide the control voltage in the controllable capacitance module 635 (of the frequency-temperature compensation module 420) in accordance with the teachings of the present invention. As illustrated, voltage control module 650 creates a temperature-dependent current I(T) (or more generally, a current I(x)), using current generator 655, as previously discussed, using one or more combinations of PTAT, $PTAT^2$ and/or CTAT current generators, and may share the I(T) generator 415 utilized with the negative transconductance amplifier 410, instead of providing a separate generator 655. The temperature-dependent current I(T) (or I(x)) is mirrored through current mirror 670 to an array or bank of a plurality of switchable resistive modules or branches 675 and a fixed capacitive module or branch 680, all configured in parallel. The resistors 685 may be any type or combination of different types, such as diffusion resistors (p or n), polysilicon, metal resistors, salicide or unsalicide polysilicon resistors, or well resistors (p or n well), for example. Each switchable resistive module 675 is switched in or out of the voltage control module 650 by a corresponding "q" coefficient of a second plurality ("x") of switching coefficients $q_0$ though $q_{(x-1)}$. When switchable resistive module 675 is switched into the circuit (such as when its corresponding coefficient is a logic high or high voltage), the resulting voltage across its corresponding resistor 685 is also temperature-dependent, due to the temperature-dependent current I(T). In a selected embodiment, three switchable resistive modules 675 were utilized, providing 8 branch combinations. As a result, the control voltage provided to node 625 is also a function of temperature, thereby providing a temperature dependence or sensitivity to the variable capacitors 615 in controllable capacitance module 635.

The first plurality of switching coefficients $p_0$ though $p_{(w-1)}$ and the second plurality of switching coefficients $q_0$ though $q_{(x-1)}$ are determined post-fabrication by testing a representative IC having the clock generator of the present invention. In the exemplary embodiments, the first plurality of switching coefficients $p_0$ though $p_{(w-1)}$ are determined first, by testing various combinations of coefficients, to provide a coarse level of adjustment, resulting in a substantially or mostly flat frequency response as a function of varying ambient temperature. The second plurality of switching coefficients $q_0$ though $q_{(x-1)}$ are then determined, also by testing various combinations of coefficients, to provide a finer level of adjustment, resulting in a substantially and significantly flat frequency response as a function of varying ambient temperature. The first and second pluralities of coefficients are then loaded into respective registers 495 and 455 in all of the ICs fabricated in the selected processing run (or batch). Depending on the fabrication processing, under other circumstances, it is possible that for higher accuracy, each IC may be separately calibrated. As result, in conjunction with the temperature compensation provided by the negative transconductance amplifier 410 and I(T) generator 415, the overall frequency response of the clock generator is substantially independent of temperature fluctuations.

As a consequence, the overall capacitance provided to the resonant LC tank 405 is distributed into a combination of fixed and variable portions, with the variable portions responsive to provide temperature compensation and, therefore, control over the resonant frequency $f_0$. The more variable capacitance CV which is switched into the circuit (controlled capacitor module 635), the greater the response to fluctuations in ambient temperature.

In addition to providing temperature compensation, it should be noted that a switched or controllable capacitance module 635 may also be utilized to select or tune the resonant frequency $f_0$.

Referring again to FIG. 4, another compensation module is also utilized to provide greater control and accuracy over the resonant frequency $f_0$, also for applications in which greater accuracy and less variance (or frequency drift) may be required, such as to provide a frequency accuracy of approximately ±0.25% or better over PVT. In these circumstances, a process variation compensation module 425 may be utilized, to provide control over the resonant frequency $f_0$ independently of fabrication process variations, such as the exemplary modules illustrated in FIGS. 11 and 12.

Figure 11:
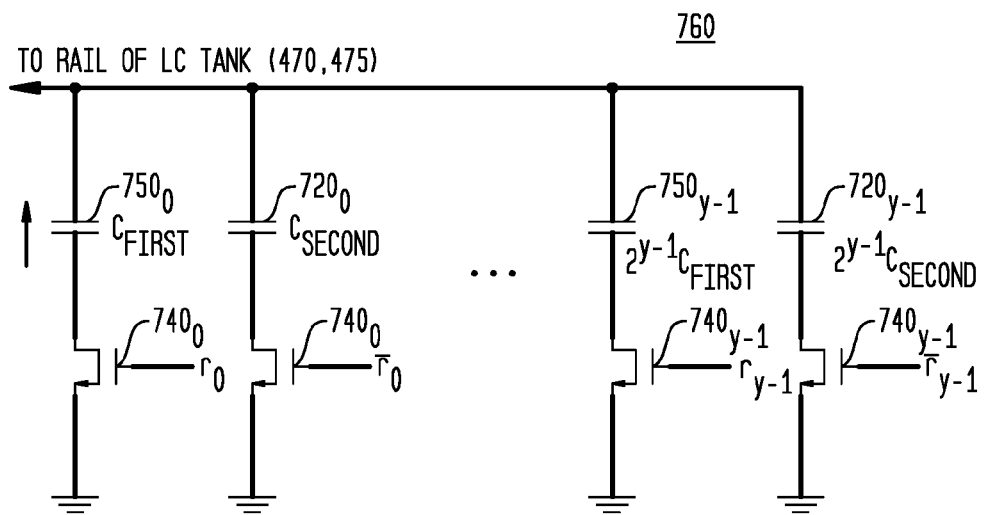
FIG. 11 is a circuit diagram illustrating an exemplary first process variation compensation module in accordance with the teachings of the present invention.

FIG. 11 is a circuit diagram illustrating an exemplary first process variation compensation module 760 in accordance with the teachings of the present invention. The first process variation compensation module 760 may be utilized as the process compensation modules 460 in FIG. 4, with each module attached to a rail or side of the resonant LC tank 405 (lines 470 and 475). In addition, each first process variation compensation module 760 is controlled by a third plurality ("y") of switching coefficients $r_0$ though $r_{(y-1)}$ stored in register 465. The first process variation compensation module 760 provides an array of switchable capacitive modules having binary-weighted, first fixed capacitances 750, for adjustment and selection of the resonant frequency $f_0$, by switching in or out a plurality of fixed capacitances 750, through a corresponding plurality of switching transistors 740 (controlled by a corresponding "r" coefficient). Again, as each capacitance branch is switched in or out of the array or circuit 760, the corresponding first fixed capacitance is added or subtracted from the total capacitance available for oscillation in the resonant LC tank, thereby modulating the resonant frequency. The third plurality of switching coefficients $r_0$ though $r_{(y-1)}$ is also determined post-fabrication using test ICs, generally as an iterative process with the determinations of the first and second pluralities of switching coefficients. This calibration is accomplished using the frequency calibration module (325 or 430) and a reference oscillator known to have a predetermined frequency. The determined "r" coefficients are then stored in the corresponding registers 465 of the ICs of that production or process batch. Alternatively, each IC may be calibrated separately, for example.

To avoid additional frequency distortions, several additional features may be implemented with this first process variation compensation module 760. First, to avoid additional frequency distortion, the on resistance of the MOS transistors 740 should be small, and therefore the transistors' width/length ratio is large. Second, large capacitances may be split into two branches, with two corresponding transistors 740 controlled by the same "r" coefficient. Third, to provide for the resonant LC tank to have a similar load under all conditions, when a first fixed capacitance 750 is switched in or out of the circuit 760, a corresponding second fixed capacitance 720, as a "dummy" capacitor (having a significantly smaller capacitance or the smallest size allowed by the design rules for the fabrication process), is correspondingly switched out of or into the circuit, based on the inverse of the corresponding "r" coefficient. As a consequence, approximately or substantially the same on resistance of the transistors 740 is always present, with only the amount of capacitance varied.

As an alternative to the use of the "dummy" capacitances, metal fuses or the like could be utilized instead of the transistors 740. Metal fuses would be left intact to include the corresponding fixed capacitance 750, and could be "blown" (open-circuited) to remove the corresponding fixed capacitance 750 from the resonant LC tank 405.

Figure 12:
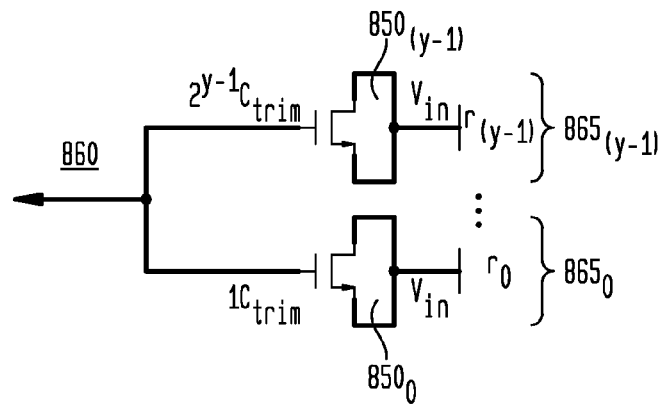
FIG. 12 is a circuit diagram illustrating an exemplary second process variation compensation module in accordance with the teachings of the present invention.

FIG. 12 is a circuit diagram illustrating an exemplary second process variation compensation module 860 in accordance with the teachings of the present invention. The second process variation compensation module 860 may be utilized as the process compensation modules 460 in FIG. 4, with each module attached to a rail or side (lines 470 and 475) of the resonant LC tank 405, instead of modules 760. In addition, each second process variation compensation module 760 would also be controlled by a third plurality of switching coefficients $r_0$ though $r_{(y-1)}$ stored in register 465. (Because of the different circuitry employed in each exemplary process variation compensation module 760 or 860, however, the corresponding third pluralities of switching coefficients $r_0$ though $r_{(y-1)}$ would, of course, be different from each other.)

It should be noted that FIG. 12 provides a varactor illustration different from those utilized in other Figures, in which a varactor 850 is represented by a MOS transistor, rather than as a capacitor with an arrow through it. Those of skill in the art will recognize that varactors are often A-MOS or I-MOS transistors, or more generally MOS transistors, such as those illustrated in FIG. 12, and configured by shorting the transistor's source and drain. As a consequence, the other illustrated varactors may be consider to include, as potential embodiments, the A-MOS or I-MOS transistors as configured as in FIG. 12. In addition, the varactors 850 are also binary-weighted with respect to each other.

The second process variation compensation module 860 has a similar structural concept, but additional notable differences from the first process variation compensation module 760. The second process variation compensation module 860 provides an array or bank of a plurality of switchable variable capacitive modules 865, without MOS switches/transistors, and hence the losses or loading through the MOS transistors are eliminated. Instead, the load appears as a low loss capacitance; such low loss also implies that the oscillator start-up power is less. In the second process variation compensation module 860, a MOS varactor 850 is switched either to ground or the power rail (voltage $V_{DD}$), thereby providing either the minimum capacitance or the maximum capacitance to the resonant LC tank 405 based upon the varactor 850 geometry. For AMOS, switched to voltage $V_{DD}$ would provide minimum capacitance and switched to ground would provide maximum capacitance, while the opposite is the case for IMOS. Again, the second process variation compensation module 860 is comprised of an array of binary-weighted variable capacitances, as varactors 850, for adjustment and selection of the resonant frequency $f_0$, by coupling a selected varactor 850 to ground or $V_{DD}$, through a corresponding "r" coefficient.

As each capacitance branch is switched to ground or $V_{DD}$, the corresponding variable capacitance is added to or not included in the total capacitance available for oscillation in the resonant LC tank, thereby modulating the resonant frequency. More particularly, for an A-MOS implementation, coupling to $V_{DD}$ (as $V_{in}$) provides lesser capacitance and coupling to ground ($V_{in}=0$) provides greater capacitance, with the opposite holding for an I-MOS implementation, in which coupling to $V_{DD}$ (as $V_{in}$) provides greater capacitance and coupling to ground ($V_{in}=0$) provides lesser capacitance, where it is assumed that the voltage on the rails of the LC tank (nodes or lines 470 and 475 of FIG. 4) is between zero V and voltage $V_{DD}$, and significantly or substantially far from either voltage level. The third plurality of switching coefficients $r_0$ though $r_{(y-1)}$ is also determined post-fabrication using test ICs, also generally as an iterative process with the determinations of the first and second pluralities of switching coefficients. The determined "r" coefficients are then stored in the corresponding registers 465 of the ICs of that production or process batch. Again, individual ICs may also be calibrated and tested separately.

It should also be noted that the illustrated embodiments for modules such as temperature compensator 315 (or 410 and 415) and process variation compensator 320 (or 425 and 460), such as those illustrated in FIGS. 6-12, may be utilized for other purposes. For example, the various illustrated embodiments for the compensator 315 (or 410 and 415) may be made dependent upon process variation, rather than temperature. Similarly, the various illustrated embodiments for the compensator 320 (or 425 and 460) may be made dependent upon temperature, rather than process variation. As a consequence, the embodiments for these and other modules should not be considered limited to the exemplary circuits and structures illustrated, as those of skill in the art will recognize additional and equivalent circuits and applications, all of which are within the scope of the invention.

Figure 13:
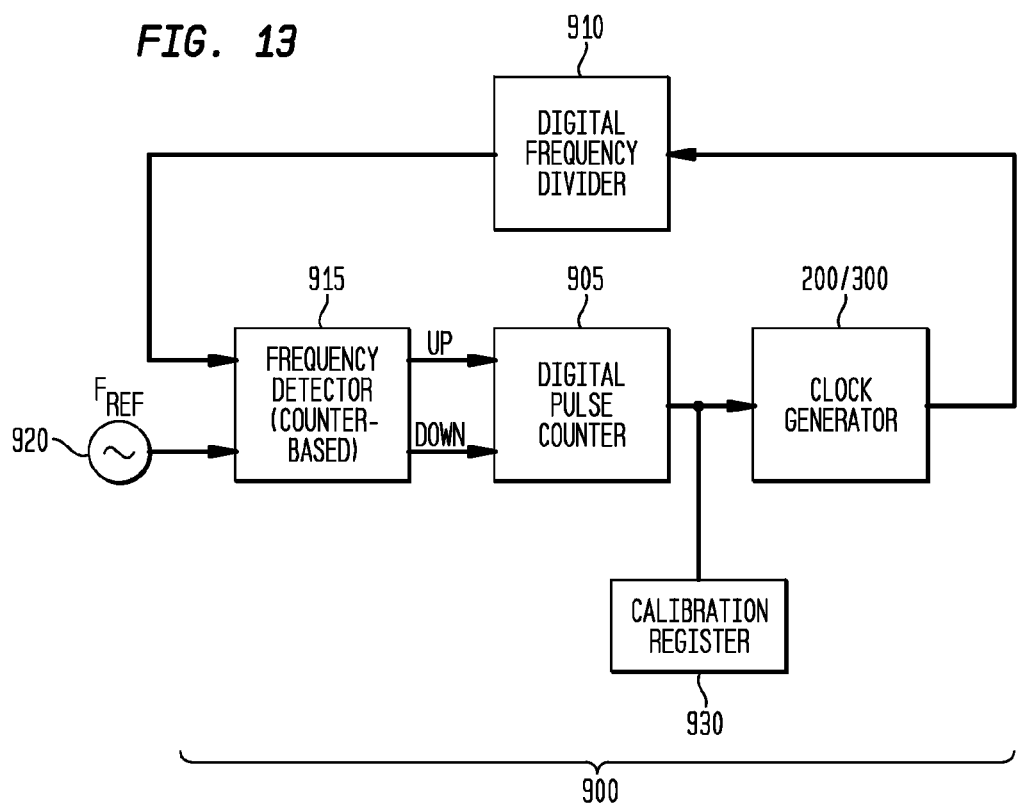
FIG. 13 is a block diagram illustrating an exemplary frequency calibration module in accordance with the teachings of the present invention.

Referring again to FIGS. 3 and 4, the clock generator and/or timing/frequency reference 300 may also include a frequency calibration module (325 or 430). This frequency calibration module is the subject of a separate patent application, but its high-level functionality is described briefly below. FIG. 13 is a high-level block diagram illustrating an exemplary frequency calibration module 900 (which may be utilized as module 325 or 430) in accordance with the teachings of the present invention. The frequency calibration module 900 includes a digital frequency divider 910, a counter-based frequency detector 915, a digital pulse counter 905, and a calibration register 930 (which also may be utilized as register 465). Using a test IC, the output signal from the clock generator (200 or 300) is frequency divided (910) and compared with a known reference frequency 920 in frequency detector 915. Depending upon whether the clock generator (200 or 300) is fast or slow with respect to the reference, down or up pulses are provided to the pulse counter 905. Based upon those results, the third plurality of switching coefficients $r_0$ though $r_{(y-1)}$ is determined, and the clock generator (200 or 300) is calibrated to a selected reference frequency. Again, individual ICs may also be calibrated and tested separately.

Referring again to FIGS. 2, 3 and 4, it will be appreciated by those of skill in the art that a highly accurate over PVT, low jitter, free-running and self-referenced oscillator has been described, providing a differential, substantially sinusoidal signal having a selectable and tunable resonant frequency, $f_0$, available at nodes 470 and 475. For many applications, this signal is sufficient, and may be utilized directly (and may be output on line 250 of FIG. 2, or line 350 of FIG. 3, or between the rails or lines 470 and 475 of FIG. 4). For example, this signal may be utilized as a timing or frequency reference. In accordance with the present invention, additional applications are available, including clock generation (substantially square wave), frequency division, low-latency frequency switching, and mode selection, as described below.

Figure 14:
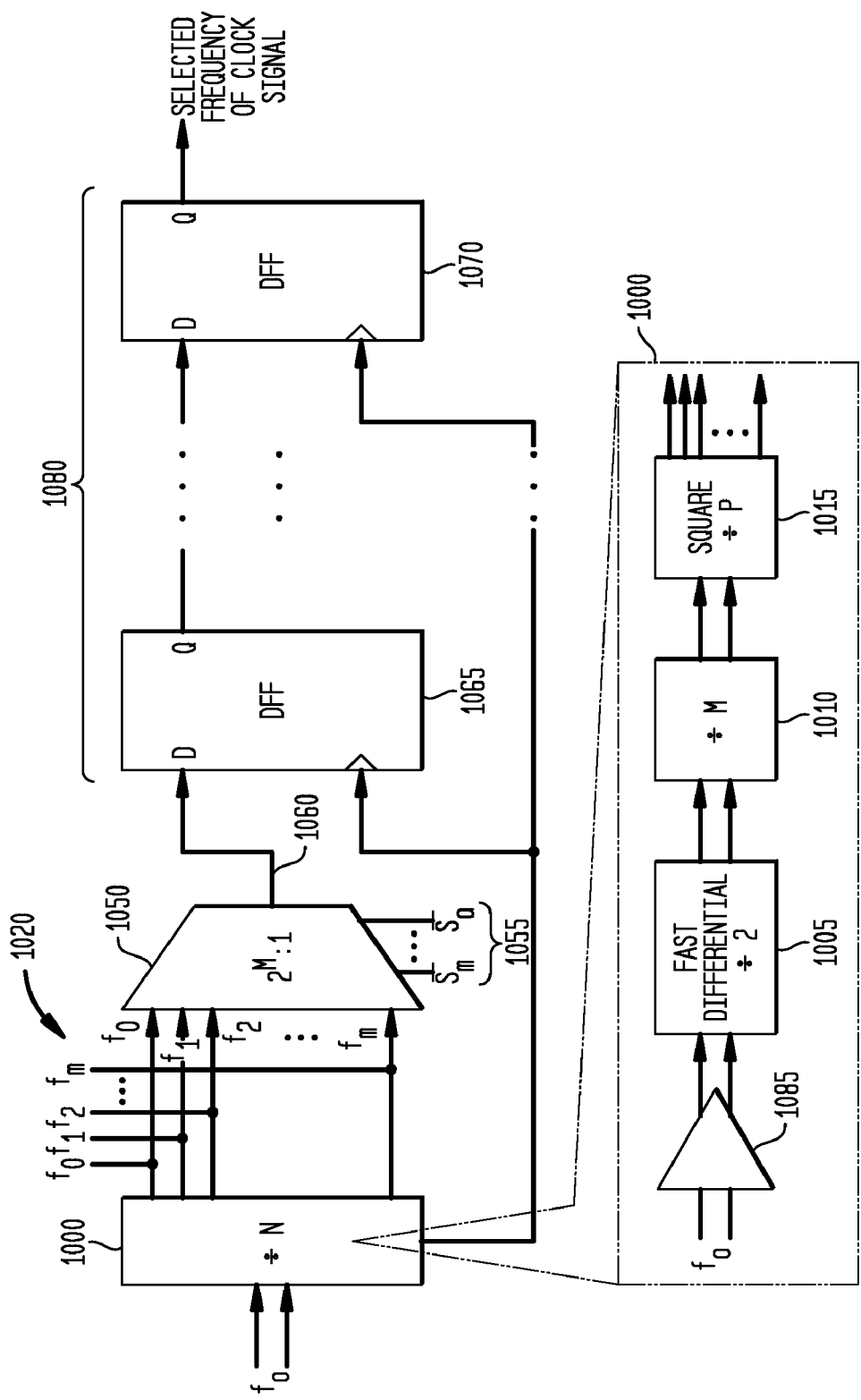
FIG. 14 is a block diagram illustrating an exemplary frequency divider, square wave generator, asynchronous frequency selector and glitch suppression module in accordance with the teachings of the present invention.

FIG. 14 is a block diagram illustrating an exemplary frequency divider and square wave generator 1000, and an exemplary asynchronous frequency selector 1050, with exemplary glitch suppression module 1080 in accordance with the teachings of the present invention. As indicated above, frequency divider and square wave generator 1000 may be included in or comprise modules 220 and/or 330, and frequency selector 1050 (with or without glitch suppression module 1080) may be included in or comprise modules 205 and/or 335.

Referring to FIG. 14, the output signal from the oscillator, namely, a substantially sinusoidal signal having a frequency $f_0$, such as output on line 250 of FIG. 2, or line 350 of FIG. 3, or between the rails or lines 470 and 475 of FIG. 4, is input into frequency divider and square wave generator 1000. The frequency of this substantially sinusoidal signal is divided by any one or more arbitrary values "N" into "m" different frequencies (including $f_0$, where appropriate), and converted to substantially square wave signals, resulting in a plurality of substantially square wave signals having m+1 different available frequencies, output on lines or bus 1020 as frequencies $f_0$, $f_1$, $f_2$, through $f_m$. Any of these substantially square wave signals having m+1 different available frequencies are selectable asynchronously through exemplary asynchronous frequency selector 1050 which, as illustrated, may be embodied as a multiplexer. The selection of any of these substantially square wave signals having m+1 different available frequencies may be accomplished through the plurality of selection lines (Sm through $S_0$) 1055, providing a substantially square wave signal having the selected frequency, output on line 1060.

As part of asynchronous frequency selection, glitch suppression is also provided by glitch suppression module 1080, which may be embodied in a plurality of ways, including through the use of one or more exemplary D flip-flops ("DFFs") illustrated in FIG. 14. A glitch could occur in an asynchronous frequency transition in which either a low state or a high state is not maintained for a sufficient period of time and may cause metastability in circuitry which is driven by the output clock signal. For example, an asynchronous frequency transition could result in a low state at a first frequency transitioning into a high state at a second frequency, at a point where the high state is about to transition back to a low state at the second frequency, resulting in a voltage spike or glitch. To avoid potential glitches from being provided as part of an output clock signal, the selected substantially square wave signal (having the selected frequency) is provided on line 1060 to a first DFF 1065 which provides a holding state; if a glitch should occur, it will be held until a clock edge triggering the DFF. To avoid the glitch occurring at the clock edge, the DFFs may be clocked at less than the maximum available frequency, or one or more additional DFFs (such as DFF 1070) may be employed, as during the wait for another clock signal, the Q output from the DFF 1065 will have stabilized to either a first state (high or low) or a second state (low or high), such as to either the power or ground rail. It has been shown by the inventors that 2 DFFs are sufficient, with additional DFFs potentially being added as may be desired, but with additional DFFs causing increased switching latency. While illustrated utilizing exemplary DFFs, other flip-flops or counters may be utilized, and those of skill in the art will recognize myriad other equivalent implementations which will achieve this result, and all such variations are within the scope of the invention.

Such exemplary low latency frequency switching in accordance with the teachings of the present invention is illustrated in FIG. 15. FIG. 15 is also illustrative of "substantially" square waves of the present invention, which are typical of actual square waves utilized in various technologies, exhibiting reasonable variation, undershoots and overshoots at their respective high and low states (and not the perfect "flatness" of textbook examples). FIG. 15, part A, illustrates asynchronous glitch-free switching from 1 MHz to 33 MHz, while part B illustrates measured glitch-free switching from 4 MHz to 8 MHz, then to 16 MHz, and then to 33 MHz.

Figure 16:
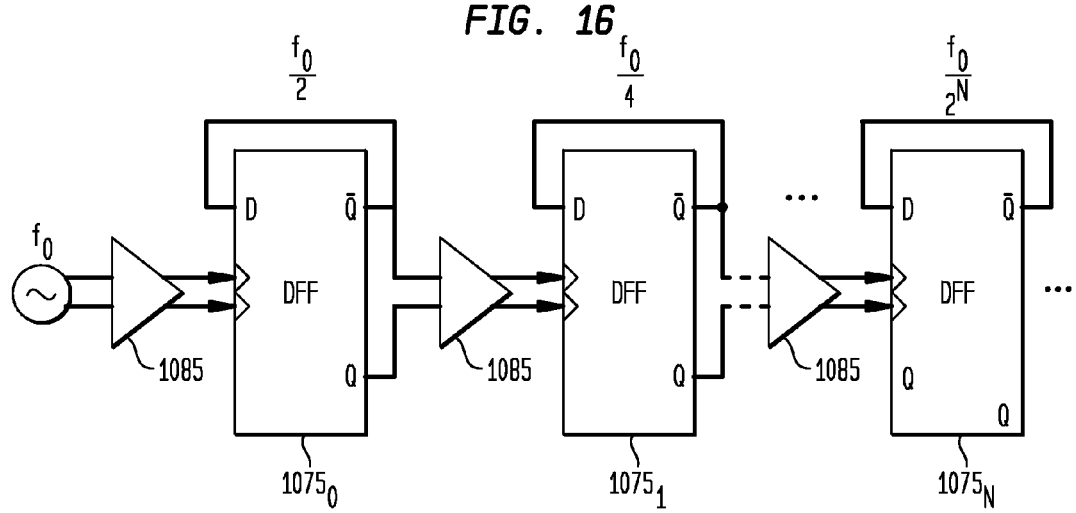
FIG. 16 is a block diagram illustrating an exemplary frequency divider in accordance with the teachings of the present invention.

Referring again to FIG. 14, the frequency divider and square wave generator 1000 may be implemented in innumerable ways, such as differential or single-ended, with the illustrated divider being merely exemplary. As the output from the oscillator illustrated in FIG. 4 is differential (across lines or rails 470 and 475), the first divider 1005 is also differential and provides complementary outputs, to present a substantially constant load to the oscillator and to maintain phase alignment, and is fast, to support high frequencies such as in the GHz range. In addition, it may be necessary or advisable to reject any relaxation mode oscillation of the first divider 1005. The second divider 1010 may also be differential and provide any arbitrary frequency division (divide by "M"), such as dividing by an integer, a multiple of two, a rational number, or any other amount or number, etc. Topologies or configuration for such dividers are known in the art, and any such divider may be utilized. Such dividers, for example and without limitation, may be a sequence (multiple stages) of counters or flip-flops 1075, such as those flip-flops illustrated in FIG. 16, which provide frequency division in powers or multiples of 2, with the output of each stage providing a clock signal for the next stage and also fed back to its own input, as illustrated. As illustrated, a plurality of frequencies are then available for output on lines or bus 1020, such as $f_0/2$, $f_0/4$, and so on, through $f_0/2^N$. In addition, as illustrated, buffers 1085 may also be utilized, from the oscillator to the first divider 1005, to provide sufficient voltage to drive the divider 1005, and also between divider stages, to isolate state-dependent load variation which could also affect signal rise and fall times.

It should also be noted that the use of the various flip-flops has also provided a substantially square wave, as any substantially sinusoidal signal has been provided to clock a flip flop, whose output is then pulled to a high or low voltage. Other square wave generators may also be utilized, as known or becomes known in the art. In the illustrated embodiments, to maintain phase alignment, differential signals are maintained through the last division. Following the last frequency division, the plurality of signals (each having a different frequency) are then squared (in module 1015) to provide substantially an evenly divided (e.g. 50:50) duty cycle, such that the time in which the signal is in a first (high) state is substantially equal to the time in which the signal is in a second (low) state.

Figure 17:
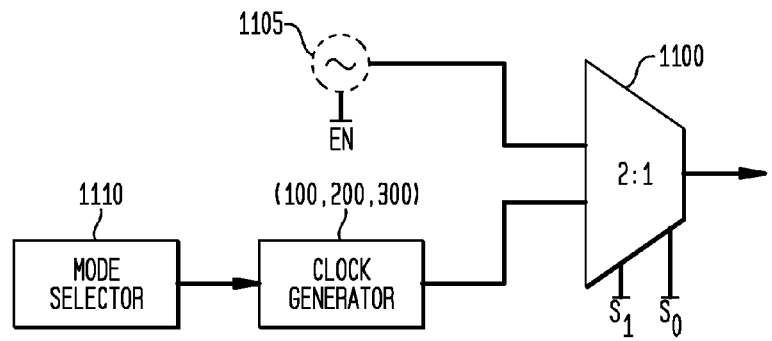
FIG. 17 is a block diagram illustrating an exemplary power mode selection module in accordance with the teachings of the present invention.

FIG. 17 is a block diagram illustrating an exemplary mode selection module in accordance with the teachings of the present invention. There are circumstances in which a highly-accurate, high performance reference, such as a clock generator (100, 200 or 300) of the invention, is unnecessary, such as in a low power, standby mode. In these circumstances, in accordance with the invention, either no clock output is provided, or a low power, reduced performance clock 1105 output is provided. For example, at comparatively low frequencies, a low performance ring oscillator may provide suitable performance with low power consumption. As illustrated in FIG. 17, for these conditions, the output of the low power oscillator 1105 may be selected (through multiplexer 1100), and provided as a clock output to other circuitry. At higher frequencies, however, such low performance oscillators consume considerably more power, typically significantly more than the oscillator of the present invention. There is typically a "break-even" point as a function of frequency, after which the clock generator (100, 200 or 300) provides both higher performance and lower power consumption, and may be selected (through multiplexer 1100), and provided as a clock output to other circuitry. As a consequence, the clock generator (100, 200 or 300) may also be utilized to provide a low power mode.

In addition, using mode selector 1110, other modes may be selected, such as a no power mode, rather than merely a low-frequency or sleep mode, as the clock generator (100, 200 or 300) may be restarted comparatively rapidly, or a pulsed mode, in which the clock generator (100, 200 or 300) is repeatedly stopped and restarted, periodically or non-periodically, in bursts or intervals. Various reference modes are discussed below.

In sharp contrast to the prior art, this pulsed clocking using the clock generator and/or timing/frequency reference (100, 200 or 300) of the present invention provides power savings or conservation. While more power may be consumed during a given burst, as the clock has a comparatively high frequency, more instructions are processed in that interval, followed by no or limited power dissipation during the non-pulse or off interval, resulting in higher MIPS/mW compared to a continuously running clock. In contrast, due to the comparatively long start-up time and locking of prior art clocks, such pulsed clocking results in more power consumption and less efficiency in the prior art.

Figure 18:
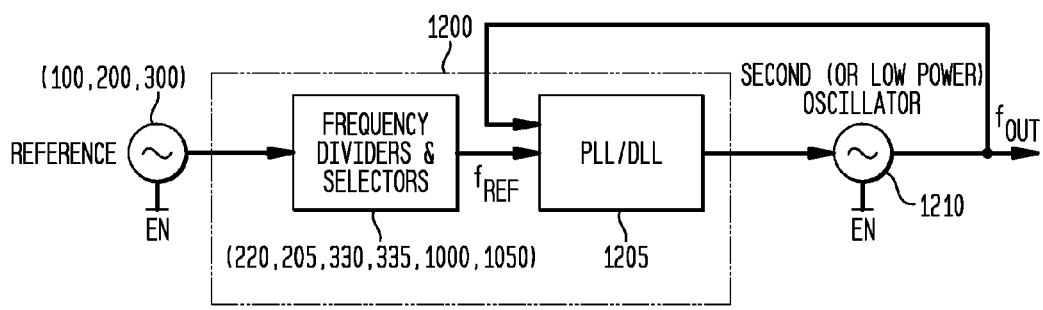
FIG. 18 is a block diagram illustrating an exemplary synchronization module for a second oscillator in accordance with the teachings of the present invention.

FIG. 18 is a block diagram illustrating an exemplary synchronization module 1200 for a second oscillator in accordance with the teachings of the present invention. As mentioned above, the clock generator and/or timing/frequency reference (100, 200 or 300) may provide a reference mode to synchronize other oscillators or clocks, which may or may not be low power, such as second oscillator 1210 (e.g., ring, relaxation, or phase shift oscillators). An output signal from the clock generator and/or timing/frequency reference (100, 200 or 300) is further frequency divided as needed to form a plurality of available reference frequencies, with a reference frequency selected from this plurality of frequencies. This may be accomplished using the modules discussed above, such as by using the existing frequency dividers (220, 330, 1000, for example), and then providing the reference signal from the frequency selector 1050 (or 205 or 335). For example, referring to FIG. 3, mode selector 345 may select a reference mode and provide the output reference signal from frequency selector 335 to a second oscillator (with synchronization module) 375. A synchronization module, such as PLL or DLL 1205, is then utilized to synchronize the output signal from the second oscillator 1210 to the reference signal provided by clock generator and/or timing/frequency reference (100, 200 or 300). In addition to a mode of continuous synchronization, a pulsed-synchronization may also be provided, in which the clock generator and/or timing/frequency reference (100, 200 or 300) provides a pulsed output, and synchronization occurs during the interval of these pulses, as a synchronization interval.

FIG. 19 is a flow diagram illustrating an exemplary method in accordance with the teachings of the present invention, and provides a useful summary. The method begins with start step 1220, such as through clock generator and/or timing/frequency reference (100, 200 or 300) start-up. It should be noted that while illustrated in FIG. 19 as consecutive steps, these steps may occur in any order, and generally may occur concurrently as the clock generator and/or timing/frequency reference (100, 200 or 300) operates. Referring to FIG. 19, a resonant signal having a resonant frequency is generated, step 1225, such as through LC tank 405 or resonator 310. The resonant frequency is adjusted in response to temperature, step 1230, such as through a temperature compensator 315, which adjusts current and frequency. The resonant frequency is adjusted in response to fabrication process variation, step 1235, such as through process variation compensator 320. The resonant signal having the resonant frequency is divided into a plurality of second signals having a corresponding plurality of frequencies, in which the plurality of frequencies are substantially equal to or lower than the resonant frequency, step 1240, such as through frequency divider 330 or 1000). An output signal is selected from the plurality of second signals, step 1245, such as through frequency selector 335 or 1050, for example. Depending upon the selected embodiment or mode, the selected output signal may be provided directly, for example, as a reference signal.

In other embodiments, such as when the output signal is a differential rather than single-ended signal, and when the resonant signal is a substantially sinusoidal signal, the method continues with converting the differential, substantially sinusoidal signal to a single-ended, substantially square wave signal having a substantially equal high and low duty cycle, as needed, step 1250, such as to generate a clock output signal using modules 330 or 1000, for example. An operating mode is also selected from a plurality of operating modes, step 1255, where the plurality of operating modes can be selected from a group comprising a clock mode, a timing and frequency reference mode, a power conservation mode, and a pulse mode, for example, such as using mode selector 225 or 345. When a reference mode is selected in step 1255, in step 1260, the method proceeds to step 1265, to synchronize a third signal (e.g., from a second oscillator) in response to the output signal, such as illustrated in FIG. 18. Following steps 1260 or 1265, the method may end or repeat (continue) (such as with the clock generator and/or timing/frequency reference (100, 200 or 300) running continuously), return step 1270.

Also in summary, the present invention provides an apparatus comprising a resonator adapted to provide a first signal having a resonant frequency; an amplifier coupled to the resonator; and a frequency controller (coupled to the resonator) which is adapted to select a resonant frequency having a first frequency of a plurality of frequencies. The apparatus also includes a frequency divider (coupled to the resonator) which is adapted to divide the first signal having the first frequency into a plurality of second signals having a corresponding plurality of frequencies, the plurality of frequencies substantially equal to or lower than the first frequency, such as by division by a rational number.

The first signal may be a differential signal or a single-ended signal. When the first signal is a differential signal, the frequency divider is further adapted to convert the differential signal to a single-ended signal. Similarly, when the first signal is a substantially sinusoidal signal, the frequency divider is further adapted to convert the substantially sinusoidal signal to a substantially square wave signal.

In various embodiments, the frequency divider may comprise a plurality of flip-flops or counters coupled successively in series, wherein an output of a selected flip-flop or counter is a frequency of a previous flip-flop or counter divided by two, or more generally, a plurality of dividers coupled successively in series, wherein an output of a successive divider is a lower frequency than the output of a previous divider. The plurality of dividers may be differential, single-ended, or differential and single-ended, such as differential followed by a final single-ended stage. The frequency divider may also include a square-wave generator adapted to convert the first signal into a substantially square-wave signal having a substantially equal high and low duty cycle.

The present invention may also include a frequency selector coupled to the frequency divider, and adapted to provide an output signal from the plurality of second signals. The frequency selector may further comprise a multiplexer and a glitch-suppressor.

The present invention may also include a mode selector coupled to the frequency selector, wherein the mode selector is adapted to provide a plurality of operating modes, which may be selected from a group comprising a clock mode, a timing and frequency reference mode, a power conservation mode, and a pulse mode.

For a reference mode, the invention may also include a synchronization circuit coupled to the mode selector; and a controlled oscillator coupled to the synchronization circuit and adapted to provide a third signal; wherein in the timing and reference mode, the mode selector is further adapted to couple the output signal to the synchronization circuit to control timing and frequency of the third signal. Such a synchronization circuit may be a delay-locked loop, a phase-locked loop, or an injection locking circuit.

In selected embodiments, the amplifier may be a negative transconductance amplifier. The frequency controller may be further adapted to modify a current through the negative transconductance amplifier in response to temperature, and may comprise a current source responsive to temperature. Such a current source may have one or more configurations selected from a plurality of configurations, such as the plurality of configurations comprising CTAT, PTAT, and PTAT$^2$ configurations. In addition, the frequency controller may be further adapted to modify a current through the negative transconductance amplifier to select the resonant frequency, modify a transconductance of the negative transconductance amplifier to select the resonant frequency, or modify a current through the negative transconductance amplifier in response to a voltage. The frequency controller may also include a voltage isolator coupled to the resonator and adapted to substantially isolate the resonator from a voltage variation, and may comprises a current mirror, which may further have a cascode configuration. The frequency controller may be further adapted to modify a capacitance or an inductance of the resonator in response to fabrication process variation, temperature variation, or voltage variation.

The frequency controller may have various embodiments for these various functions, and may further comprise: a coefficient register adapted to store a first plurality of coefficients; and a first array having a plurality of switchable capacitive modules coupled to the coefficient register and to the resonator, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to a control voltage. The plurality of switchable capacitive modules may be binary-weighted, or have another weighting scheme. The frequency controller may also include a second array having a plurality of switchable resistive modules coupled to the coefficient register and further having a capacitive module, the capacitive module and the plurality of switchable resistive modules further coupled to a node to provide the control voltage, each switchable resistive module responsive to a corresponding coefficient of a second plurality of coefficients stored in the coefficient register to switch the switchable resistive module to the control voltage node; and a temperature-dependent current source coupled through a current mirror to the second array.

The frequency controller may also include a process variation compensator coupled to the resonator and adapted to modify the resonant frequency in response to fabrication process variation. In an exemplary embodiment, the process variation compensator may comprise: a coefficient register adapted to store a plurality of coefficients; and an array having a plurality of switchable capacitive modules coupled to the coefficient register and to the resonator, each switchable capacitive module having a first fixed capacitance and a second fixed capacitance, each switchable capacitive module responsive to a corresponding coefficient of the plurality of coefficients to switch between the first fixed capacitance and the second fixed capacitance. The plurality of switchable capacitive modules may be binary-weighted, or have another weighting scheme.

In another exemplary embodiment the process variation compensator may comprise: a coefficient register adapted to store a plurality of coefficients; and an array having a plurality of switchable variable capacitive modules coupled to the coefficient register and to the resonator, each switchable variable capacitive module responsive to a corresponding coefficient of the plurality of coefficients to switch between a first voltage and a second voltage. The plurality of switchable variable capacitive modules also may be binary-weighted, or have another weighting scheme.

The present invention may also include a frequency calibration module coupled to the frequency controller and adapted to modify the resonant frequency in response to a reference signal. For example, the frequency calibration module may include a frequency divider coupled to the frequency controller, the frequency divider adapted to convert an output signal derived from the first signal having the first frequency to a lower frequency to provide a divided signal; a frequency detector coupled to the frequency divider, the frequency detector adapted to compare the reference signal to the divided signal and provide one or more up signals or down signals; and a pulse counter coupled to the frequency detector, the pulse counter adapted to determine a difference between the one or more up signals or down signals as an indicator of a difference between the output signal and the reference signal.

The resonator used with the invention may comprise an inductor (L) and a capacitor (C) coupled to form an LC-tank, having a selected configuration of a plurality of LC-tank configurations, such as series, parallel and so on, and may include other components. In other embodiments, the resonator may be selected from a group comprising: a ceramic resonator, a mechanical resonator, a microelectromechanical resonator, and a film bulk acoustic resonator, or any other resonator which is electrically equivalent to an inductor (L) coupled to a capacitor (C).

The apparatus of the invention may be utilized as a timing and frequency reference, or as a clock generator. In addition, the invention may also include a second oscillator (such as a ring, relaxation, or phase shift oscillator) providing a second oscillator output signal; and a mode selector coupled to the frequency controller and to the second oscillator, the mode selector adapted to switch to the second oscillator output signal to provide a power conservation mode. Additional operating modes may be provided by a mode selector coupled to the frequency controller, which may be adapted to periodically start and stop the resonator to provide a pulsed output signal, or adapted to selectively start and stop the resonator to provide a power conservation mode.

In another selected embodiment, the apparatus of the invention, comprises: a resonator adapted to provide a first signal having a resonant frequency; an amplifier coupled to the resonator; a temperature compensator coupled to the amplifier and to the resonator, the temperature compensator adapted to modify the resonant frequency in response to temperature; a process variation compensator coupled to the resonator, the process variation compensator adapted to modify the resonant frequency in response to fabrication process variation; a frequency divider coupled to the resonator, the frequency divider adapted to divide the first signal having the resonant frequency into a plurality of second signals having a corresponding plurality of frequencies, the plurality of frequencies substantially equal to or lower than the resonant frequency; and a frequency selector coupled to the frequency divider, the frequency selector adapted to provide an output signal from the plurality of second signals.

In another selected embodiment, the apparatus of the invention generates a clock signal, and comprises: an LC resonator adapted to provide a differential, substantially sinusoidal first signal having a resonant frequency; a negative transconductance amplifier coupled to the LC resonator; a temperature compensator coupled to the negative transconductance amplifier and to the LC resonator, the temperature compensator adapted to modify a current in the negative transconductance amplifier in response to temperature and further to modify a capacitance of the LC resonator in response to temperature; a process variation compensator coupled to the LC resonator, the process variation compensator adapted to modify the capacitance of the LC resonator in response to fabrication process variation; a frequency divider coupled to the resonator, the frequency divider adapted to convert and divide the first signal having the resonant frequency into a plurality of single-ended, substantially square-wave second signals having a corresponding plurality of frequencies, the plurality of frequencies substantially equal to or lower than the resonant frequency, and each second signal having a substantially equal high and low duty cycle; and a frequency selector coupled to the frequency divider, the frequency selector adapted to provide an output signal from the plurality of second signals.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus, comprising:
   a reference resonator adapted to provide a first reference signal having a resonant frequency;
   a frequency controller coupled to the reference resonator, the frequency controller adapted to be calibrated to determine the resonant frequency having a first frequency of a plurality of frequencies; and
   an amplifier coupled to the reference resonator;
   wherein the frequency controller further comprises:
      a temperature compensator coupled to the amplifier;
      a voltage isolator coupled to the reference resonator; and
      a process variation compensator coupled to the reference resonator.

2. The apparatus of claim 1, further comprising:
   a frequency divider coupled to the reference resonator, the frequency divider adapted to divide the first frequency by a rational number into a plurality of second signals having a corresponding plurality of frequencies, the plurality of frequencies substantially equal to or lower than the first frequency.

3. The apparatus of claim 2, wherein the frequency divider further comprises a square-wave generator, the square-wave generator adapted to convert the first reference signal into a substantially square-wave signal having a substantially equal high and low duty cycle.

4. The apparatus of claim 2, further comprising:
   a frequency selector coupled to the frequency divider, the frequency selector adapted to provide an output signal from the plurality of second signals.

5. The apparatus of claim 4, further comprising:
   a mode selector coupled to the frequency selector, the mode selector adapted to provide a plurality of operating modes, the plurality of operating modes selected from a group comprising a clock mode, a timing and frequency reference mode, a power conservation mode, and a pulse mode.

6. The apparatus of claim 5, further comprising:
   a synchronization circuit coupled to the mode selector; and
   a controlled oscillator coupled to the synchronization circuit and adapted to provide a third signal;
   wherein in the timing and frequency reference mode, the mode selector is further adapted to couple the output signal to the synchronization circuit to control timing and frequency of the third signal.

7. The apparatus of claim 6, wherein the synchronization circuit is a delay-locked loop, a phase-locked loop, or an injection locking circuit.

8. An apparatus, comprising:
   a reference resonator adapted to provide a first reference signal having a resonant frequency;
   a frequency controller coupled to the reference resonator, the frequency controller adapted to be calibrated to determine the resonant frequency having a first frequency of a plurality of frequencies; and
   an amplifier coupled to the reference resonator, said amplifier comprising a negative transconductance amplifier;
   wherein the frequency controller is further adapted to modify a current through the negative transconductance amplifier in response to temperature;
   wherein the frequency controller further comprises a current source responsive to temperature; and
   wherein the current source further comprises one or more CTAT, PTAT, or $PTAT^2$ configurations.

9. The apparatus of claim 8, wherein the frequency controller is further adapted to modify a current through the negative transconductance amplifier to modify the resonant frequency of the reference resonator.

10. An apparatus, comprising:
    a reference resonator adapted to provide a first reference signal having a resonant frequency;
    a frequency controller coupled to the reference resonator, the frequency controller adapted to be calibrated to determine the resonant frequency having a first frequency of a plurality of frequencies; and
    an amplifier coupled to the reference resonator, said amplifier comprising a negative transconductance amplifier;
    wherein the frequency controller is further adapted to modify a current through the negative transconductance amplifier in response to temperature; and
    wherein the frequency controller is further adapted to modify a transconductance of the negative transconductance amplifier to modify the resonant frequency of the reference resonator.

11. The apparatus of claim 10, wherein the frequency controller further comprises a voltage isolator coupled to the reference resonator and adapted to substantially isolate the reference resonator from a voltage variation.

12. The apparatus of claim 11, wherein the voltage isolator comprises a current mirror having a cascode configuration.

13. The apparatus of claim 10, wherein the frequency controller is further adapted to modify a capacitance or modify an inductance of the reference resonator in response to a temperature variation, a voltage variation, or both a temperature and voltage variation.

14. An apparatus, comprising:
a reference resonator adapted to provide a first reference signal having a resonant frequency; and
a frequency controller coupled to the reference resonator, the frequency controller adapted to be calibrated to determine the resonant frequency having a first frequency of a plurality of frequencies, said frequency controller further comprising:
a first array having a plurality of switchable capacitive modules coupled to the reference resonator, each switchable capacitive module having a fixed capacitance and a variable capacitance, each switchable capacitive module responsive to a corresponding coefficient of a first plurality of calibration coefficients to switch between the fixed capacitance and the variable capacitance and to switch each variable capacitance to a control voltage.

15. The apparatus of claim 14, wherein the frequency controller further comprises:
a second array having a plurality of switchable resistive modules having a capacitive module, the capacitive module and the plurality of switchable resistive modules further coupled to a node to provide the control voltage, each switchable resistive module responsive to a corresponding coefficient of a second plurality of coefficients to switch the switchable resistive module to the control voltage node; and
a temperature-dependent current source coupled through a current mirror to the second array.

16. An apparatus, comprising:
a reference resonator adapted to provide a first reference signal having a resonant frequency; and
a frequency controller coupled to the reference resonator, the frequency controller adapted to be calibrated to determine the resonant frequency having a first frequency of a plurality of frequencies;
wherein the frequency controller further comprises:
an array having a plurality of switchable variable capacitive modules coupled to the reference resonator, each switchable variable capacitive module responsive to a corresponding coefficient of a first plurality of calibration coefficients to switch between a first voltage and a second voltage.

17. The apparatus of claim 16, wherein at least one of the first voltage and second voltage is a fixed voltage.

18. The apparatus of claim 16, wherein at least one of the first voltage and second voltage is a variable voltage.

19. An apparatus, comprising:
a reference resonator adapted to provide a first reference signal having a resonant frequency; and
a frequency controller coupled to the reference resonator, the frequency controller adapted to be calibrated to determine the resonant frequency having a first frequency of a plurality of frequencies;
wherein the frequency controller further comprises:
an array having a plurality of switchable capacitive modules coupled to the reference resonator, each switchable capacitive module having a fixed capacitance and a fuse, each switchable capacitive module responsive to a corresponding coefficient of a first plurality of calibration coefficients to open circuit the fuse.

20. An apparatus, comprising:
a reference resonator adapted to provide a first reference signal having a resonant frequency;
a frequency controller coupled to the reference resonator, the frequency controller adapted to be calibrated to determine the resonant frequency having a first frequency of a plurality of frequencies; and
a frequency calibration module coupled to the frequency controller, the frequency calibration module adapted to determine the calibration of the frequency controller in response to a second reference signal;
wherein the frequency calibration module comprises:
a frequency divider coupled to the frequency controller, the frequency divider adapted to convert an output signal derived from the first reference signal having the first frequency to a lower frequency to provide a divided signal;
a frequency detector coupled to the frequency divider, the frequency detector adapted to compare the second reference signal to the divided signal and provide one or more up signals or down signals; and
a pulse counter coupled to the frequency detector, the pulse counter adapted to determine a difference between the one or more up signals or down signals as an indicator of a difference between the output signal and the second reference signal.

21. The apparatus of claim 20, wherein the reference resonator comprises an inductor (L) and a capacitor (C) coupled to form an LC-tank.

22. The apparatus of claim 20, wherein the reference resonator comprises at least one of the following resonators: a ceramic resonator, a mechanical resonator, a microelectromechanical resonator, and a film bulk acoustic resonator.

23. The apparatus of claim 20, wherein the apparatus is integrated monolithically with a second circuit to form a single integrated circuit.

24. The apparatus of claim 23, wherein the second circuit is a microprocessor, a digital signal processor, a radio frequency circuit, or a communications circuit.

25. An apparatus, comprising:
a reference resonator adapted to provide a first reference signal having a resonant frequency;
a frequency controller coupled to the reference resonator, the frequency controller adapted to be calibrated to determine the resonant frequency having a first frequency of a plurality of frequencies;
a second oscillator providing a second oscillator output signal; and
a mode selector coupled to the frequency controller and to the second oscillator, the mode selector adapted to switch to the second oscillator output signal to provide a power conservation mode.

26. The apparatus of claim 25, wherein the second oscillator is a ring oscillator, a relaxation oscillator, or a phase shift oscillator.

27. An apparatus, comprising:
a reference resonator adapted to provide a first reference signal having a resonant frequency; and
a frequency controller coupled to the reference resonator, the frequency controller adapted, when calibrated, to select the resonant frequency having a first frequency of a plurality of frequencies;
wherein the frequency controller further comprises:
a first array having a plurality of switchable capacitive modules coupled to the reference resonator, each switchable capacitive module having a fixed capacitance and a variable capacitance, each switchable capacitive module responsive to a corresponding coefficient of a first plurality of calibration coefficients to switch between the fixed capacitance and the variable capacitance and to switch each variable capacitance to a control voltage.

28. The apparatus of claim 27, wherein the frequency controller further comprises:
a second array having a plurality of switchable resistive modules coupled to the coefficient register and further having a capacitive module, the capacitive module and the plurality of switchable resistive modules further coupled to a node to provide the control voltage, each switchable resistive module responsive to a corresponding coefficient of a second plurality of coefficients stored in the coefficient register to switch the switchable resistive module to the control voltage node; and
a temperature-dependent current source coupled through a current mirror to the second array.

29. The apparatus of claim 27, further comprising:
a negative transconductance amplifier coupled to the reference resonator; and
wherein the frequency controller is further adapted to modify a current through the negative transconductance amplifier in response to temperature.

30. The apparatus of claim 29, wherein the frequency controller further comprises a current source responsive to temperature.

31. An apparatus, comprising:
a reference resonator adapted to provide a first reference signal having a resonant frequency; and
a frequency controller coupled to the reference resonator, the frequency controller adapted, when calibrated, to select the resonant frequency having a first frequency of a plurality of frequencies; and
a negative transconductance amplifier coupled to the reference resonator;
wherein the frequency controller is further adapted to modify a current through the negative transconductance amplifier in response to temperature;
wherein the frequency controller further comprises a current source responsive to temperature; and
wherein the current source further comprises one or more CTAT, PTAT, or PTAT$^2$ configurations.

32. The apparatus of claim 31, further comprising:
a frequency divider coupled to the reference resonator, the frequency divider adapted to divide the first frequency by a rational number into a plurality of second signals having a corresponding plurality of frequencies, the plurality of frequencies substantially equal to or lower than the first frequency.

33. The apparatus of claim 32, wherein the frequency divider further comprises a square-wave generator, the square-wave generator adapted to convert the first reference signal into a substantially square-wave signal having a substantially equal high and low duty cycle.

34. An apparatus, comprising:
a reference oscillator adapted to provide a first reference signal having an oscillation frequency;
an amplifier coupled to the reference oscillator;
a process variation compensator coupled to the reference oscillator, the process variation compensator adapted to determine the oscillation frequency when calibrated for fabrication process variation; and
a temperature compensator coupled to the amplifier or the reference oscillator, the temperature compensator adapted to maintain substantially the determined oscillation frequency of the reference oscillator in response to a temperature variation;
wherein the temperature compensator further comprises:
a coefficient register adapted to store a first plurality of coefficients and a second plurality of coefficients;
a first array having a plurality of binary-weighted switchable capacitance branches coupled to the coefficient register and to the reference oscillator, each switchable capacitance branch having a fixed capacitance and a variable capacitance and responsive to a corresponding coefficient of the first plurality of coefficients to switch between the fixed capacitance and the variable capacitance and to switch the variable capacitance to a control voltage node;
a second array coupled to the control voltage node, the second array having a plurality of switchable resistances coupled to the coefficient register and further having a fixed capacitance, each switchable resistive module responsive to a corresponding coefficient of the second plurality of coefficients to switch the switchable resistive module to the control voltage node; and
a temperature-dependent current source coupled through a current mirror to the second array.

35. An apparatus, comprising:
a reference oscillator adapted to provide a first reference signal having an oscillation frequency;
an amplifier coupled to the reference oscillator;
a process variation compensator coupled to the reference oscillator, the process variation compensator adapted to determine the oscillation frequency when calibrated for fabrication process variation; and
a temperature compensator coupled to the amplifier or the reference oscillator, the temperature compensator adapted to maintain substantially the determined oscillation frequency of the reference oscillator in response to a temperature variation;
wherein the process variation compensator further comprises:
a coefficient register embodied as one or more memory circuits and adapted to store a first plurality of calibration coefficients; and
wherein the process variation compensator further comprises:
a first array having a plurality of switchable capacitive modules coupled to the coefficient register and to the reference oscillator, each switchable capacitive module having a fixed capacitance and a variable capacitance, each switchable capacitive module responsive to a corresponding coefficient of the first plurality of calibration coefficients to switch between the fixed capacitance and the variable capacitance and to switch each variable capacitance to a control voltage.

36. An apparatus, comprising:
a reference oscillator adapted to provide a first reference signal having an oscillation frequency;
an amplifier coupled to the reference oscillator;
a process variation compensator coupled to the reference oscillator, the process variation compensator adapted to determine the oscillation frequency when calibrated for fabrication process variation; and
a temperature compensator coupled to the amplifier or the reference oscillator, the temperature compensator adapted to maintain substantially the determined oscillation frequency of the reference oscillator in response to a temperature variation;

wherein the process variation compensator further comprises:
  a coefficient register embodied as one or more memory circuits and adapted to store a first plurality of calibration coefficients; and
wherein the process variation compensator further comprises:
  a first array having a plurality of switchable resistive modules coupled to the coefficient register and further having a capacitive module, the capacitive module and the plurality of switchable resistive Modules further coupled to a node to provide the control voltage, each switchable resistive module responsive to a corresponding coefficient of a second plurality of coefficients stored in the coefficient register to switch the switchable resistive module to the control voltage node; and
  a temperature-dependent current source coupled through a current mirror to the second array.

37. The apparatus of claim 36, wherein the process variation compensator further comprises:
  an array having a plurality of switchable capacitive modules coupled to the coefficient register and to the reference oscillator, each switchable capacitive module having a first fixed capacitance and a second fixed capacitance, each switchable capacitive module responsive to a corresponding coefficient of the first plurality of calibration coefficients to switch between the first fixed capacitance and the second fixed capacitance.

* * * * *

UNITED STATES PATENT AND TRADEMARK OFFICE
CERTIFICATE OF CORRECTION

PATENT NO.         : 7,924,110 B2                                Page 1 of 1
APPLICATION NO.    : 12/435269
DATED              : April 12, 2011
INVENTOR(S)        : McCorquodale et al.

It is certified that error appears in the above-identified patent and that said Letters Patent is hereby corrected as shown below:

In the Patent:
Column 1, Line 46; Please insert the following language before FIELD OF INVENTION:

--GOVERNMENT FUNDING

This invention was made with Government support under NSF Grant (EEC) 9986866 awarded by the National Science Foundation. The Government has certain rights in this invention.--

Signed and Sealed this
Eleventh Day of December, 2012

David J. Kappos
*Director of the United States Patent and Trademark Office*